United States Patent
Niwa

(10) Patent No.: US 11,637,564 B2
(45) Date of Patent: Apr. 25, 2023

(54) DATA TRANSFER DEVICE, CONTROL DEVICE, SETTING DEVICE, AND CONTROL METHOD FOR DATA TRANSFER DEVICE

(71) Applicant: OMRON Corporation, Kyoto (JP)

(72) Inventor: Yoshimi Niwa, Kusatsu (JP)

(73) Assignee: OMRON CORPORATION, Kyoto (JP)

( * ) Notice: Subject to any disclaimer, the term of this patent is extended or adjusted under 35 U.S.C. 154(b) by 56 days.

(21) Appl. No.: 17/604,762

(22) PCT Filed: Mar. 3, 2020

(86) PCT No.: PCT/JP2020/008877
§ 371 (c)(1),
(2) Date: Oct. 19, 2021

(87) PCT Pub. No.: WO2020/240960
PCT Pub. Date: Dec. 3, 2020

(65) Prior Publication Data
US 2022/0182071 A1    Jun. 9, 2022

(30) Foreign Application Priority Data

May 29, 2019 (JP) .............................. JP2019-100589

(51) Int. Cl.
*H03M 7/36* (2006.01)
*G05B 19/05* (2006.01)
(Continued)

(52) U.S. Cl.
CPC ........ *H03M 7/3044* (2013.01); *G05B 19/058* (2013.01); *G05B 19/124* (2013.01); *H03M 7/3062* (2013.01)

(58) Field of Classification Search
CPC ............ H03M 7/3044; H03M 7/3062; H03M 7/3059; G05B 19/058; G05B 2219/42256; H04L 12/40; H04L 2012/4026
(Continued)

(56) References Cited

U.S. PATENT DOCUMENTS

| | | | |
|---|---|---|---|
| 8,553,041 B1* | 10/2013 | Danskin | .................... G06T 9/00 345/530 |
| 2004/0146106 A1* | 7/2004 | De Lameillieure | .... H04N 19/30 375/E7.206 |
| 2019/0296757 A1* | 9/2019 | Kuwahara | ............. H03M 13/03 |

FOREIGN PATENT DOCUMENTS

| | | |
|---|---|---|
| JP | H07302260 | 11/1995 |
| JP | 2007142547 | 6/2007 |
| JP | 2018024045 | 2/2018 |

OTHER PUBLICATIONS

Machine English Translation of JPH7302260A, "A Method for Controlling Data", Ogawa Haruki, Nov. 14, 1995, pp. 1-5. (Year: 1995).*

(Continued)

*Primary Examiner* — Don N Vo
(74) *Attorney, Agent, or Firm* — JCIPRNET

(57) ABSTRACT

The present invention suppresses the data size of a data frame to be transmitted to a control device at every control period even if oversampling is performed. A counter unit (10) compresses the data size of sampling data (Sd) indicating a second or subsequent count value (Ct) to the number of bits by which the maximum (Vmax) of a count value countable in one sampling processing can be represented.

18 Claims, 22 Drawing Sheets

(51) Int. Cl.
   *G05B 19/12*      (2006.01)
   *H03M 7/30*       (2006.01)
(58) Field of Classification Search
   USPC ........................................................ 375/224
   See application file for complete search history.

(56) References Cited

OTHER PUBLICATIONS

Machine English Translation of JP2007142547A "Coding Method and Decoding Method, and Coder and Decoder Employing Same", Yamaya Haruki, Jun. 7, 2007, pp. 1-16. (Year: 2007).*

Machine English Translation of JP2018024045A, "Information Processing System, Information Processor, Workpiece Position Specification Method, and Workpiece Position Specification Program", Shimamura Junji, Feb. 15, 2018., pp. 1-16. (Year: 2018).*

"International Search Report (Form PCT/ISA/210) of PCT/JP2020/008877," dated Jun. 2, 2020, with English translation thereof, pp. 1-4.

"Written Opinion of the International Searching Authority (Form PCT/ISA/237) of PCT/JP2020/008877," dated Jun. 2, 2020, with English translation thereof, pp. 1-9.

* cited by examiner in case of sampling at control period of 1 ms and sampling period of 10 μs

| item | related art | present embodiment | |
|---|---|---|---|
| | | compressed data size 1 byte | compressed data size 2 bits |
| data size | 4 bytes × 100 = 400 bytes per 1 ch | 4 bytes + 99 bytes = 103 bytes per 1 ch | 4 bytes + 198 bits = 29 bytes per 1 ch |
| compared with related art | 100% | 26% | 7.25% |

FIG. 5

| setting item | setting value |
|---|---|
| control period [ms] | 1 |
| number of times of sampling | 10 |
| encoder resolution | 360 |
| maximum rotation speed [rpm] | 6000 |
| pulse direction | bidirectional |

FIG. 18

DATA TRANSFER DEVICE, CONTROL DEVICE, SETTING DEVICE, AND CONTROL METHOD FOR DATA TRANSFER DEVICE

CROSS-REFERENCE TO RELATED APPLICATION

This application is a 371 application of the International PCT application serial no. PCT/JP2020/008877, filed on Mar. 3, 2020, which claims the priority benefits of Japan Patent Application No. 2019-100589, filed on May 29, 2019. The entirety of each of the above-mentioned patent applications is hereby incorporated by reference herein and made a part of this specification.

TECHNICAL FIELD

The present invention relates to a data transfer device that stores a plurality of pieces of sampling data indicating measurement results in respective sampling processes executed a plurality of times in one control period in one data frame and transmits the sampling data to a control device in every control period.

BACKGROUND ART

In the related art, executing oversampling at a production site such as a factory for the purpose of improving the accuracy of control processing executed by a control device such as a programmable logic controller (PLC) is known. For example, Patent Literature 1 below discloses a configuration in which a counter unit measures a movement amount of a conveyor a plurality of times at intervals shorter than a communication interval (that is, a control period) with a controller, and a plurality of measured movement amounts and each of measurement timings of the movement amount are transmitted to the controller.

CITATION LIST

Patent Literature

[Patent Literature 1]
Japanese Patent Laid-Open No. 2018-24045

SUMMARY OF INVENTION

Technical Problem

However, the above-described technique of the related art has a problem that a data size of a data frame transmitted to a control device in every control period becomes large due to execution of oversampling.

One aspect of the present invention has been made in view of the above problems, and an objective thereof is to implement a data transfer device capable of reducing a data size of a data frame to be transmitted to a control device in every control period even if oversampling is performed.

Solution to Problem

In order to solve the above problem, according to one aspect of the present invention, there is provided a data transfer device that stores a plurality of pieces of sampling data indicating respective measurement results in a plurality of sampling processes executed in one control period in one data frame and transmits the sampling data to a control device at each of the control period, and includes an acquisition part that acquires the measurement results in the respective executed sampling processes, and a compression part that, in a case where a maximum of a change between the measurement results in two of the sampling processes executed consecutively at the one control period is determined in advance, compresses the measurement result in each of second and subsequent sampling processes among the plurality of the measurement results acquired by the acquisition part to the sampling data with a data size by which the maximum is able to be represented.

In order to solve the above problem, according to one aspect of the present invention, there is provided a control method for a data transfer device that stores a plurality of pieces of sampling data indicating respective measurement results in a plurality of sampling processes executed in one control period in one data frame and transmits the sampling data to a control device at each of the control period, the control method including an acquisition step of acquiring the measurement results in the respective executed sampling processes, and a compression step of, in a case where a maximum of a change between the measurement results in two of the sampling processes executed consecutively at the one control period is determined in advance, compressing a measurement result in each of second and subsequent sampling processes among the plurality of the measurement results acquired in the acquisition step to the sampling data with a data size by which the maximum is able to be represented.

Advantageous Effects of Invention

According to one aspect of the present invention, it is possible to achieve an effect of being able to reduce a data size of a data frame to be transmitted to a control device in every control period even if oversampling is performed.

BRIEF DESCRIPTION OF DRAWINGS

FIG. 5 is a table for describing an effect achieved by the data compression process in FIG. 4.

FIG. 18 is a diagram illustrating an example of information used when a tool in FIG. 1 calculates a compression size.

DESCRIPTION OF EMBODIMENTS

Embodiment 1

Figure 1:
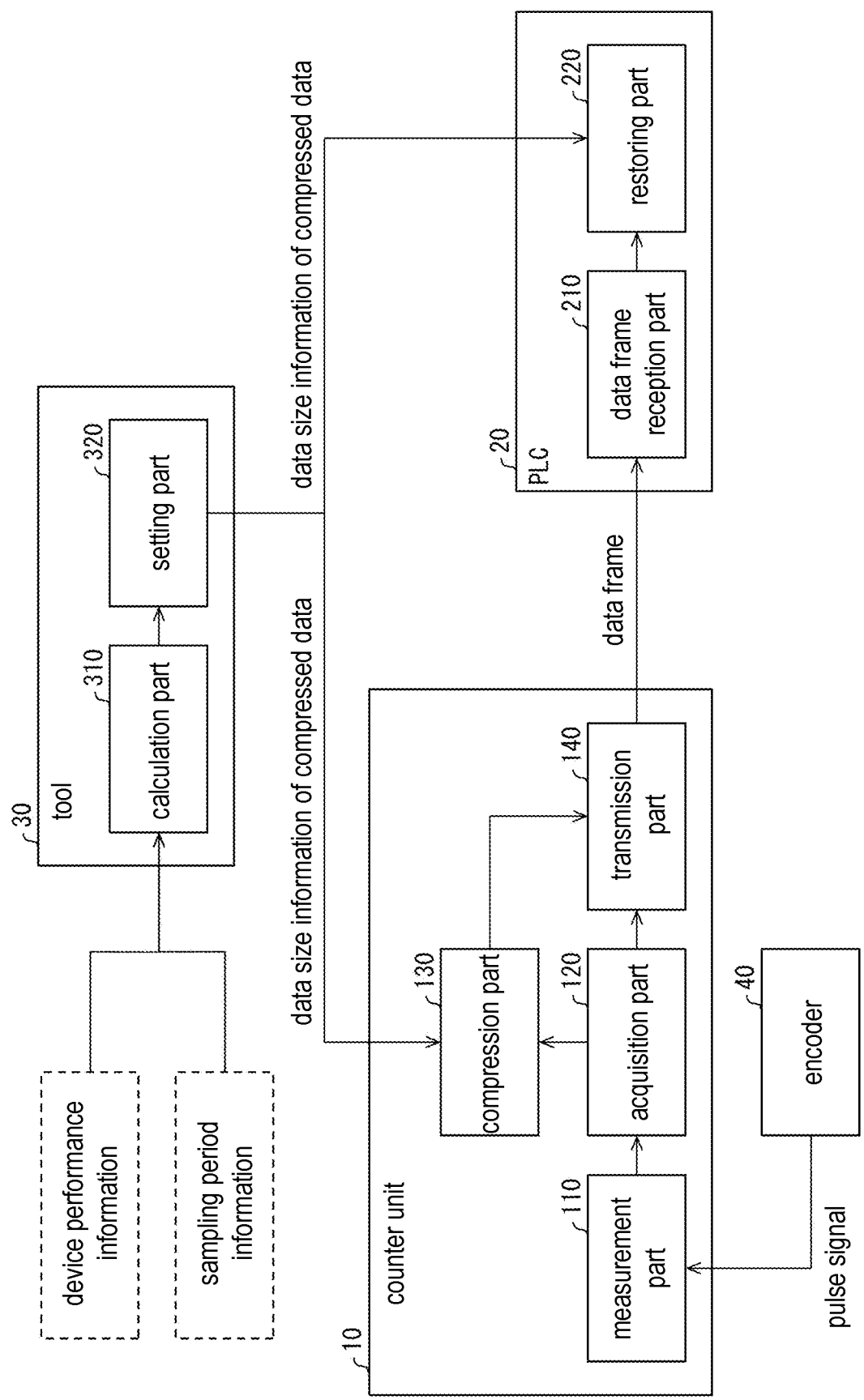
FIG. 1 is a block diagram illustrating a configuration of main parts of a counter unit or the like according to Embodiment 1 of the present invention.

Hereinafter, an embodiment according to one aspect of the present invention (hereinafter, also referred to as the "present embodiment") will be described with reference to FIGS. 1 to 22. The same or corresponding parts in the drawings are given the same reference numerals, and description thereof will not be repeated. In the present embodiment, for example, a counter unit 10 will be described as a typical example of a data transfer device. An analog unit 60 is also an example of a data transfer device, and details thereof will be described later. For better understanding of the counter unit 10 according to one aspect of the present invention, first, an outline of a control system 1 including the counter unit 10 will be described with reference to FIG. 2.

In the following description, "n" represents an integer of "2" or greater, and "m" represents an integer of "2" or greater and "n" or smaller. A numerical value expressed in hexadecimal notation is indicated by adding "0x" (zero x) representing a hexadecimal number in front of the numerical value, and a numerical value expressed in binary notation is indicated by adding "b" (bee) representing a binary number in front of the numerical value.

1. Application Example (Overview of Control System)

Figure 2:
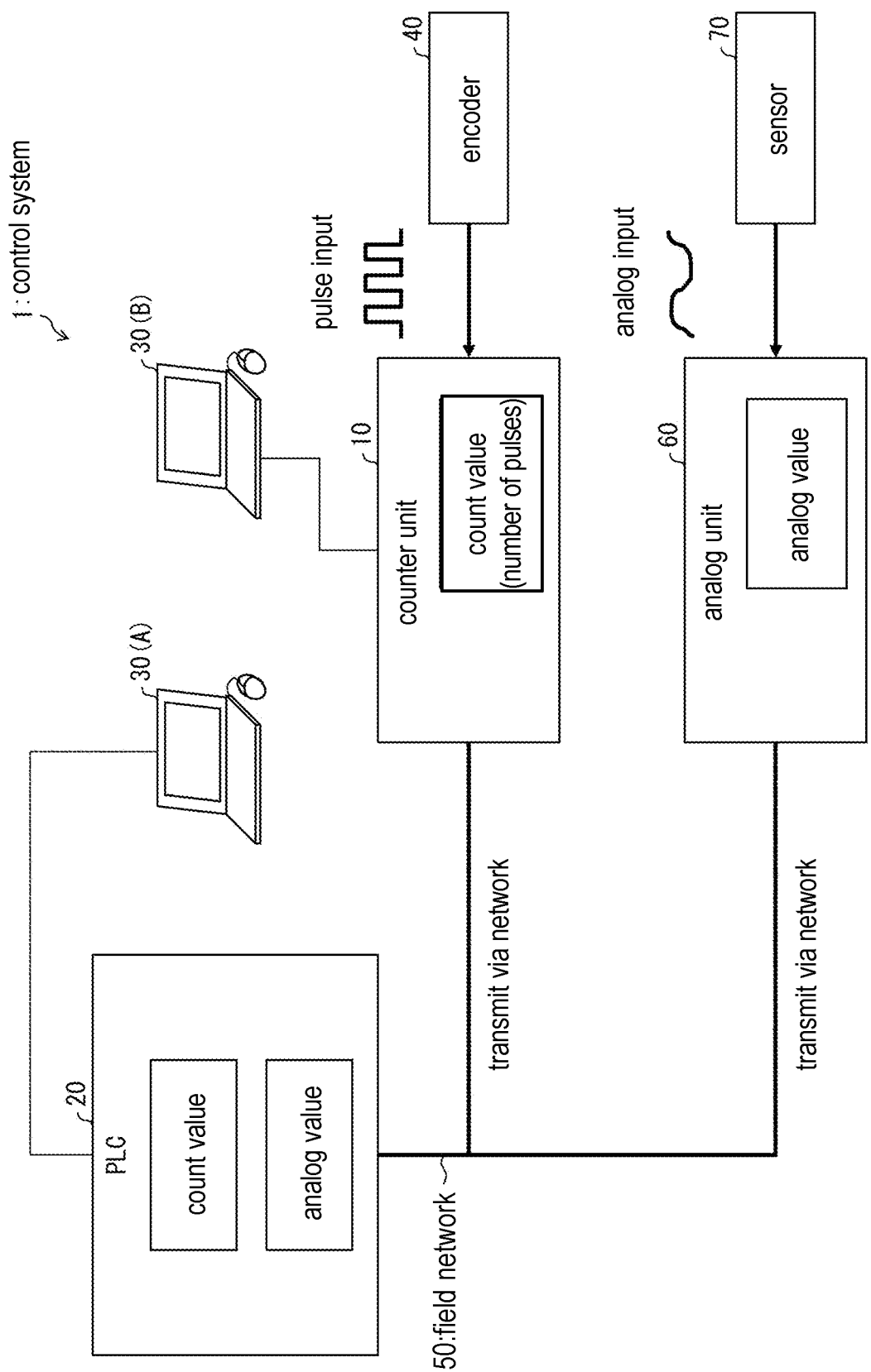
FIG. 2 is a diagram illustrating an overview of a control system including the counter unit in FIG. 1.

FIG. 2 is a diagram illustrating an overview of the control system 1 including the counter unit 10. As illustrated in FIG. 2, the control system 1 includes the counter unit 10 that is a data transfer device and a programmable logic controller (PLC) 20 that is a control device (controller). The control system 1 may further include an analog unit 60 that is a data transfer device. The control system 1 is a master-slave control system including the PLC 20 as a master device, and the counter unit 10 and the analog unit 60 as slave devices connected to the master device via a network (field network 50). The PLC 20 is referred to as a "master device" in the sense that it manages data transmission via the field network 50.

The PLC 20 is a control device (controller) that controls the entire control system 1, and is communicatively connected to each of the counter unit 10 and the analog unit 60. The PLC 20 acquires information from an encoder 40 and a sensor 70, which are input devices (measurement devices), as input data via the counter unit 10 and the analog unit 60, respectively. The PLC 20 executes a calculation process by using the acquired input data according to a user program incorporated in advance. The PLC 20 executes the calculation process to determine control details for the control system 1, for example, determines control details for an output device (not illustrated) such as an actuator, and outputs control data corresponding to the control details to the output device. For example, a display part and an operation part (not illustrated) may be connected to the PLC 20. The display part is configured with a liquid crystal panel or the like capable of displaying an image, and the operation part is typically configured with a touch panel, a keyboard, a mouse, and the like.

The field network 50 transfers various data received by the PLC 20 or transmitted by the PLC 20, and is, for example, EtherCAT (registered trademark), PROFINE (registered trademark), MECHATROLINK (registered trademark)-III, Powerlink, SERCOS (registered trademark)-III, or CIP Motion. The field network 50 may be, for example, EtherNet/IP (registered trademark), DeviceNet, or CompoNet (registered trademark). In the following description, the control system 1 in which data is transmitted and received between the PLC 20 and the slave device by sequentially transferring data frames on the field network 50 will be described. That is, data is transmitted and received between the PLC 20 and the counter unit 10, and data is also transmitted and received between the PLC 20 and the analog unit 60 by sequentially transferring data frames on the field network 50. Data may be transmitted and received between a plurality of slave devices, that is, between the counter unit 10 and the analog unit 60 by sequentially transferring data frames on the field network 50.

The counter unit 10 is a data transfer device (communication coupler) that receives a pulse signal generated by the encoder 40, and transmits data indicating the number of pulses (hereinafter, also referred to as a "count value Ct") of the received pulse signal to the PLC 20 in every sampling period Smc.

The counter unit 10 is a slave device in a network (field network 50) using the PLC 20 as a master device, and is communicatively connected to the PLC 20 via the field network 50. The counter unit 10 transmits and receives data (more specifically, a data frame) to and from the PLC 20 using regular communication periods, specifically, in every control period Sct of the PLC 20.

The counter unit 10 is communicatively connected to the encoder 40 and receives a pulse signal generated by the encoder 40 as an input. The counter unit 10 executes a process of counting the number of pulses (count value Ct) in every sampling period Smc of the pulse signal received from the encoder 40, that is, executes a sampling process. The counter unit 10 generates a plurality of pieces of sampling data Sd each indicating the count value Ct in every sampling period Smc, stores the plurality of pieces of sampling data Sd in one data frame, and transmits (transfers) the plurality of pieces of sampling data Sd to the PLC 20.

Here, the sampling period Smc is a "time interval per one sampling process" executed by the counter unit 10, and the sampling period Smc is smaller than the control period Sct. The counter unit 10 executes a plurality of sampling processes in one control period Sct, in other words, executes oversampling. The counter unit 10 stores a plurality of pieces of sampling data Sd each indicating the count value Ct measured in each sampling process in one data frame, and transmits the plurality of pieces of sampling data Sd to the PLC 20 in every control period Sct. The counter unit 10 stores n pieces of sampling data Sd indicating respective measurement results (count values Ct) in the n sampling processes executed in one control period Sct in one data frame, and transmits the n pieces of sampling data Sd to the PLC 20 in every control period Sct.

The encoder 40 is a device that outputs a measurement result to the counter unit 10, and specifically, is a pulse signal generation device (measurement device) that outputs a pulse signal according to a measured amount to the counter unit 10. The encoder 40 is attached to, for example, a conveyor, and generates a pulse signal according to a movement amount of the conveyor, that is, according to a movement amount of a workpiece. The encoder 40 outputs a pulse wave to the counter unit 10 every time the conveyor (that is, the workpiece) is moved by a predetermined amount.

The analog unit 60 is a data transfer device (communication coupler) that receives an analog signal generated by the sensor 70, and transmits data indicating a value of the received analog signal in every sampling period Smc (hereinafter, also referred to as an "analog value A1") to the PLC 20.

The analog unit 60 is a slave device in a network (field network 50) using the PLC 20 as a master device, and is communicatively connected to the PLC 20 via the field network 50. The analog unit 60 transmits and receives data (more specifically, a data frame) to and from the PLC 20 using regular communication periods, specifically, in every control period Sct of the PLC 20.

The analog unit 60 is communicatively connected to the sensor 70, and receives an analog signal generated by the sensor 70 as an input. The analog unit 60 executes a process of measuring a value (analog value A1) of the analog signal received from the sensor 70 in every sampling period Smc, that is, executes a sampling process. The analog unit 60 generates a plurality of pieces of sampling data Sd each indicating the analog value A1 in every sampling period Smc, stores the plurality of pieces of sampling data Sd in one data frame, and transmits (transfers) the plurality of pieces of sampling data Sd to the PLC 20.

Here, the sampling period Smc of the analog unit 60, that is, a "time interval per one sampling process" executed by the analog unit 60 is smaller than the control period Sct. The analog unit 60 executes a plurality of sampling processes in one control period Sct, in other words, executes oversampling. The analog units 60 stores a plurality of pieces of sampling data Sd each indicating the analog value A1 measured in each sampling process in one data frame, and transmits the plurality of pieces of sampling data Sd to the PLC 20 in every control period Sct. The analog unit 60 stores n pieces of sampling data Sd indicating respective measurement results (analog values A1) in n sampling processes executed in one control period Sct in one data frame, and transmits the n pieces of sampling data Sd to the PLC 20 in every control period Sct.

The sensor 70 is a device that outputs a measurement result to the analog unit 60, and specifically, is an analog signal generation device (measurement device) that outputs an analog signal according to a measured amount to the counter unit 10, and is, for example, a length measuring sensor. The sensor 70 is mounted above the conveyor, for example, and generates an analog signal according to a distance to a workpiece placed on the conveyor.

In the control system 1 illustrated in FIG. 2, the tool 30(A) and the tool 30(B) are respectively connected to the PLC 20 and the counter unit 10 via, for example, communication cables that are Universal Serial Bus (USB) cables. In the following description, in a case where it is not necessary to distinguish between the tool 30(A) and the tool 30(B), they are simply referred to as a "tool 30".

The tool 30 is a setting device that generates various setting information for the control system 1 and sets the generated setting information for each device configuring the control system 1. The tool 30 is typically configured with a general purpose computer. For example, an information processing program executed by the tool 30 may be stored in a compact disk-read only memory (CD-ROM) (not illustrated) and distributed. The program stored in this CD-ROM is read by a CD-ROM drive device (not illustrated) and stored in a hard disk or the like of the tool 30. Alternatively, the tool 30 may be configured to download a program similar to a program stored in a CD-ROM from a higher-level host computer or the like via a network. The tool 30 may be realized by a human machine interface (HMI).

The tool 30 includes, for example, a display part and displays predetermined information regarding the control system 1. The tool 30 receives, for example, a user operation from a user. The tool 30 changes various settings of the control system 1 (for example, each of the PLC 20, the counter unit 10, and the analog unit 60) according to the received user operation. The tool 30 generates setting information for each of the counter unit 10 and the analog unit 60 from the received user operation, that is, acquires the setting information according to the user operation.

The setting information includes, for example, "information indicating the number of sampling processes executed by each of the counter unit 10 and the analog unit 60 in one control period Sct". The "information indicating the number of sampling processes executed by each of the counter unit 10 and the analog unit 60 in one control period Sct" may be information indicating the sampling period Smc and the control period Sct of each of the counter unit 10 and the analog unit 60.

The setting information may include, for example, information indicating "the number of pulse signals receivable by the counter unit 10 in one sampling process" and "an amount of change in the analog value A1 that is changeable in one sampling period Smc". Here, "the number of pulse signals receivable by the counter unit 10 in one sampling process" may be calculated based on at least one of a specification and an application (usage of a pulse signal generation device) of a pulse signal generation device such as the encoder 40. In a case where pulse signals from the pulse signal generation device are counted, the number of pulse signals receivable by the counter unit 10 per unit time is determined in advance by a resolution and a rotation speed (maximum rotation speed) of the pulse signal generation device. The maximum rotation speed may be determined based on the specification (performance) of the pulse signal generation device, and may also be determined based on the application thereof. For example, if the application is a "low-speed application in which the pulse signal generation device rotates at a maximum of 60 rpm at the resolution of 360", even if the pulse signal generation device can rotate at a higher speed in terms of specification, the maximum rotation speed may be assumed to be 60 rpm. Therefore, "the number of pulse signals receivable by the counter unit 10 in one sampling process" may be calculated from "the resolution and the maximum rotation speed of the pulse signal generation device" that are determined in advance based on at least one of the specification and the application. Therefore, the setting information may include information indicating "the resolution and the maximum rotation speed of the pulse signal generation device" that are determined in advance based on at least one of the specification and the application instead of the information indicating "the number of pulse signals receivable by the counter unit 10 in one sampling process".

The setting information may include information indicating "a pulse count method type indicating whether the pulse count method of the counter unit 10 is unidirectional or bidirectional". The pulse count method type may indicate whether a pulse signal output by a pulse signal generation device such as the encoder 40 is a unidirectional pulse signal or a bidirectional pulse signal.

The tool 30 uses the acquired setting information to generate information related to the data frame received by the PLC 20 from each of the counter unit 10 and the analog unit 60, and in particular, information indicating a data size of the sampling data Sd. The tool 30 sets the generated "information related to the data frame" for at least one of the PLC 20, the counter unit 10, and the analog unit 60.

For example, the tool 30 acquires the setting information for the counter unit 10 indicating "the number of pulse signals receivable by the counter unit 10 in one sampling process", the sampling period Smc of the counter unit 10, the pulse count method, and the like. As described above, the information indicating "the number of pulse signals receivable by the counter unit 10 in one sampling process" may be the information indicating the resolution and the maximum rotation speed of the encoder 40.

The tool 30 generates information related to the data frame transmitted by the counter unit 10 to the PLC 20 based on the acquired setting information for the counter unit 10 and the control period Sct, and in particular, information indicating a data size of the sampling data Sd. For example, the tool 30 calculates a data size of each of the pieces of sampling data Sd(2) to Sd(n) indicating respective measurement results in "the second and subsequent sampling processes executed by the counter unit 10 in one control period Sct". In the following description, each data size of the pieces of sampling data Sd(2) to Sd(n) will also be referred to as a "compression size". The tool 30 sets (notifies) the calculated compression size for at least one of the PLC 20 and the counter unit 10 as the information related to the data frame transmitted by the counter unit 10.

Similarly, the tool 30 acquires the setting information for the analog unit 60 and the control period Sct, and generates information related to a data frame transmitted by the analog unit 60 to the PLC 20 based on the setting information for the analog unit 60 and the control period Sct. For example, the tool 30 calculates a data size (compression size) of each of the pieces of sampling data Sd(2) to Sd(n) indicating respective measurement results in "the second and subsequent sampling processes executed by the analog unit 60 in one control period Sct". The tool 30 sets the calculated compression size for at least one of the PLC 20 and the analog unit 60.

(Application Example of Control System)

Figure 3:
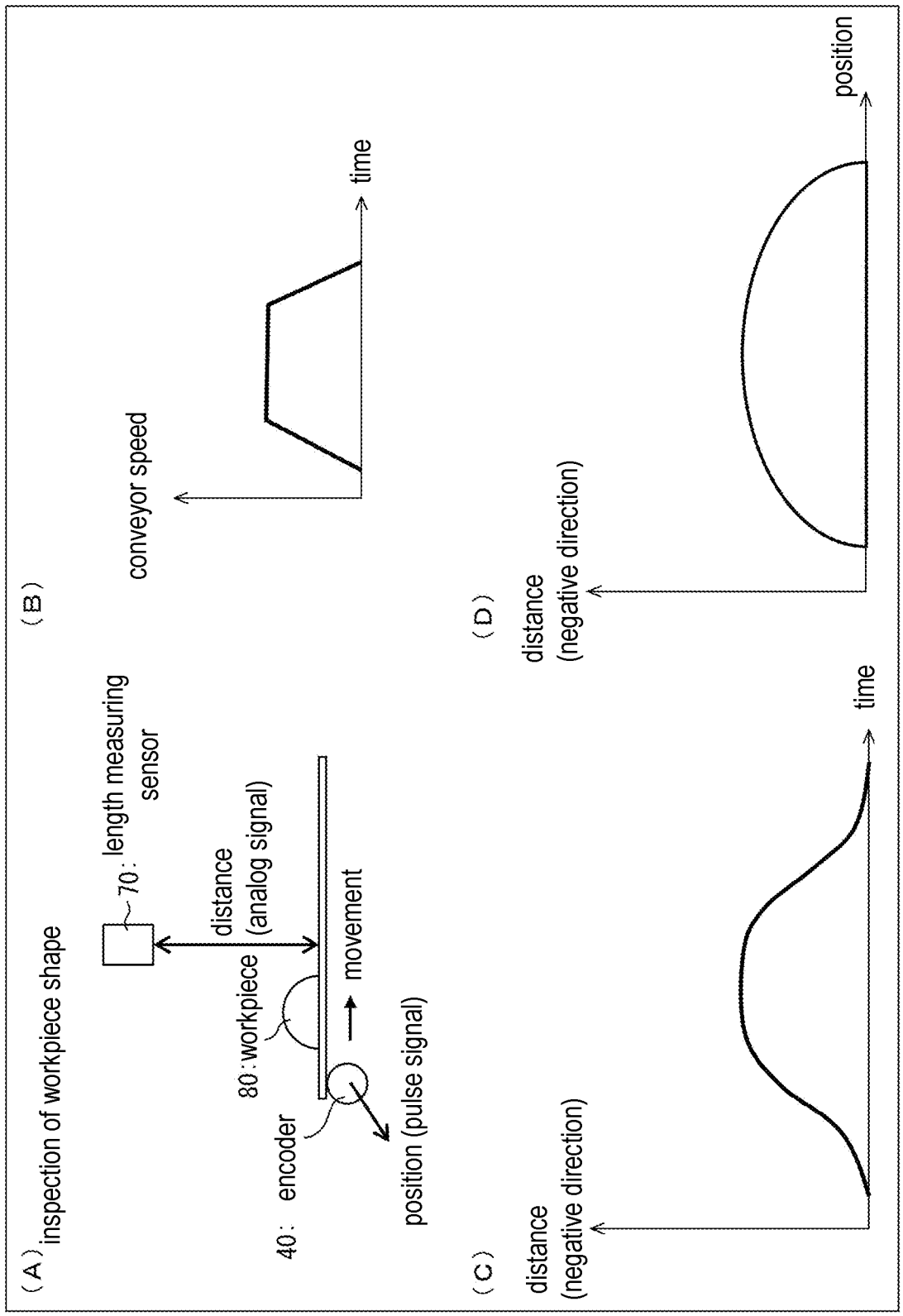
FIG. 3 is a diagram illustrating an application example of the control system in FIG. 2.

FIG. 3 is a diagram illustrating an application example of the control system 1 illustrated in FIG. 2. As illustrated in (A) of FIG. 3, the control system 1 is used to inspect, for example, a shape of a workpiece 80 that is placed and moved on the conveyor. The encoder 40 outputs a pulse signal according to a position of the conveyor, that is, a position of the workpiece 80, and the sensor 70 outputs an analog signal according to a distance to the workpiece 80.

As illustrated in (B) of FIG. 3, in a case where a conveyor speed is not constant, if a distance (negative direction) is set on a vertical axis and time is set on a horizontal axis, the conveyor speed changes (that is, a change in the position of the workpiece 80 per unit time), and, thus, as illustrated in (C) of FIG. 3, a shape of the workpiece 80 to be measured is distorted. In contrast, as illustrated in (D) of FIG. 3, if a distance (negative direction) is set on the vertical axis and the position is set on the horizontal axis, the same data is obtained regardless of a workpiece position and a conveyor speed, and pattern matching can be easily performed.

(Role of Data Transfer Device in Control System)

As described so far with reference to FIGS. 2 and 3, each of the counter unit 10 and the analog unit 60 executes a plurality of (for example, n) sampling processes in one control period Sct. Each of the counter unit 10 and the analog unit 60 transmits a plurality of pieces of sampling data Sd corresponding to the measurement results in the respective executed sampling processes to the PLC 20. That is, each of the counter unit 10 and the analog unit 60 transmits the sampling data Sd for the number of times of sampling to the PLC 20 in every control period Sct. For example, in a case where n sampling processes are executed during one control period Sct, n pieces of sampling data Sd indicating respective n measurement results (for example, n count values Ct) measured in the n sampling processes are transmitted to the PLC 20 in every control period Sct.

When such oversampling is performed, a data size of the sampling data Sd generally becomes a problem due to restrictions in the system. In particular, in a case where the counter unit 10 and the analog unit 60 are used in combination as in the control system 1, a data size of data (more specifically, a data frame) transferred on the field network 50 in one control period Sct becomes enormous.

For example, in a case where the control period Sct is 1 ms and the sampling period Smc is 10 μs, the counter unit 10 generates 100 count values Ct per control period Sct and transmits 100 pieces of sampling data Sd per control period Sct to the PLC 20. Assuming thin one piece of sampling data Sd has a size of 4 bytes, a data size of a data frame repeatedly transmitted to the PLC 20 by the counter unit 10 in every control period Sct is equal to or more than 400 bytes that is 100 times the size of 4 bytes.

Similarly, in a case where the control period Sct is 1 ms and the sampling period Smc is 10 μs, the analog unit 60 generates 100 count values Ct per control period Sct, and transmits 100 pieces of sampling data Sd per control period Sct to the PLC 20. Assuming thin one piece of sampling data Sd has a size of 2 bytes, a data size of a data frame repeatedly transmitted to the PLC 20 by the analog unit 60 in every control period Sct is equal to or more than 200 bytes that is 100 times the size of 2 bytes.

Here, in the control system 1, an upper limit of the data size of the data frame repeatedly transmitted by each of the counter unit 10 and the analog unit 60 to the PLC 20 in every control period Sct is set to, for example, 1024 bytes. For the entire field network 50, an upper limit of a data size of data (more specifically, a data frame) that is repeatedly transferred on the field network 50 in every control period Sct is set to, for example, 5736 bytes.

Therefore, each of the counter unit 10 and the analog unit 60 compresses the data size of the sampling data Sd transmitted to the PLC 20 in one control period Sct to alleviate the problem of data size restrictions on the system.

(Data Compression)

Figure 4:
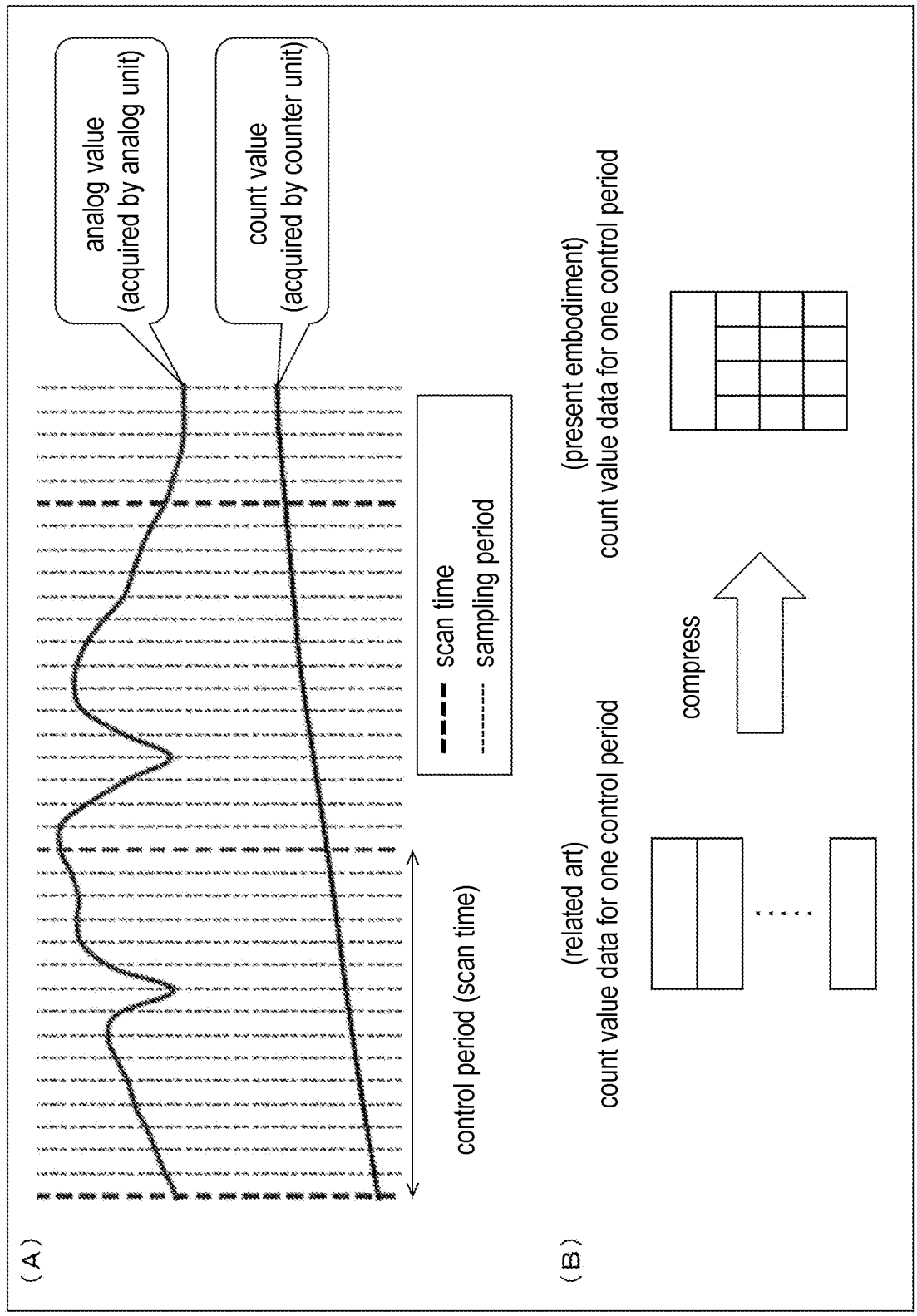
FIG. 4 is a diagram illustrating an outline of a data compression process executed by the control system in FIG. 2.

FIG. 4 is a diagram illustrating an outline of a data compression process executed in the control system 1. As illustrated in (A) of FIG. 4, each of the counter unit 10 and the analog unit 60 executes a plurality of sampling processes in one control period Sct (also referred to as a "scan time"). The counter unit 10 acquires the count value Ct in each of a plurality of sampling processes executed during one control period Sct, and the analog unit 60 acquires the analog value A1 in each of a plurality of sampling processes executed during one control period Sct.

As illustrated in (B) of FIG. 4, each of the counter unit 10 and the analog unit 60 compresses the sampling data Sd to be transmitted to the PLC 20 in every control period Sct. Specifically, in the sampling data Sd transmitted by each of the counter unit 10 and the analog unit 60 to the PLC 20 in every control period Sct, only the first sampling data Sd(1) is data with a full size. Each of the remaining sampling data Sd(2) to Sd(n) is data with a compression size.

The full size is, for example, a data size of the sampling data Sd in which a measurement result (for example, the count value Ct(1) or the analog value A1(1)) in the first sampling process is stored without being compressed, and is "4 bytes" unless otherwise specified in the following description.

On the other hand, the "compression size" that is a data size of the "remaining sampling data Sd" is a data size (number of bits) sufficient to represent a measurement result that is changeable in one sampling period Smc. Each of the counter unit 10 and the analog unit 60 compresses a bit string indicating a measurement result in each of the second and subsequent sampling processes to "a size (that is, a compression size) sufficient to represent a measurement result that is changeable in one sampling period Smc". The details of the "compression size" will be described later with reference to FIGS. 7 to 10.

That is, the counter unit 10 executes a plurality of sampling processes in one control period Sct, and transmits the sampling data Sd indicating the count value Ct counted in each of the executed plurality of sampling processes to the PLC 20 in every control period Sct. The counter unit 10 compresses each data size of "the pieces of sampling data Sd(2) to Sd(n) indicating respective the count values Ct(2) to Ct(n)" to a compression size, and transmits the pieces of sampling data Sd(2) to Sd(n) to the PLC 20 in every control period Sct.

Similarly, the analog unit 60 executes a plurality of sampling processes in one control period Sct, and transmits the sampling data Sd indicating the analog value A1 measured in each of the plurality of executed sampling processes to the PLC 20 in every control period Sct. The analog unit 60 compresses each data size of "the pieces of sampling data Sd(2) to Sd(n) indicating respective the analog values A1(2) to A1(n)" to a compression size, and transmits the pieces of sampling data Sd(2) to Sd(n) to the PLC 20 in every control period Sct.

(Effects Achieved by Data Transfer Device)

FIG. 5 is a table for describing effects achieved by each of the counter unit 10 and the analog unit 60. In FIG. 5, it is assumed that a data size of a measurement result measured by each of the counter unit 10 and the analog unit 60 in one sampling process is 4 bytes, that is, a full size of the sampling data Sd is 4 bytes. For example, in a case where the control period Sct is 1 ms and the sampling period Smc is 10 µs, that is, in a case where 100 pieces of sampling data Sd are transmitted to the PLC 20 in every control period Sct, in the present embodiment, a data size is as follows compared with a data size in the related art.

That is, in the related art, 100 pieces of 4-byte sampling data Sd, that is, 400-byte data per channel (for example, per data frame) is repeatedly transmitted to the PLC 20 in every control period Sct.

On the other hand, in the counter unit 10, a data size of one piece of sampling data Sd(1) indicating the count value Ct(1) in the first sampling process executed in one control period Sct remains 4 bytes. The counter unit 10 compresses data sizes of the remaining 99 pieces of sampling data Sd(2) to Sd (99).

For example, in a case where the counter unit 10 compresses the data size of each of the remaining 99 pieces of sampling data Sd to 1 byte, a data size of one data frame transmitted by the counter unit 10 to the PLC 20 in every control period Sct is 103 bytes. This corresponds to about 26% of 400 bytes of the related art.

In a case where the counter unit 10 compresses the data size of each of the remaining 99 pieces of sampling data Sd to 2 bits, the data size of one data frame transmitted by the counter unit 10 to the PLC 20 in every control period Sct is about 29 bytes. This corresponds to about 7.25% of 400 bytes of the related art.

2. Configuration Example

The outline of the control system 1 has been described hitherto with reference to FIGS. 2 to 5. Next, details of the counter unit 10, the analog unit 60, the PLC 20, and the tool 30 will be described. First, an outline of the counter unit 10 that will be described in detail below with reference to FIG. 1 and the like is summarized as follows.

The counter unit 10 (data transfer device) is a data transfer device that stores a plurality of pieces of sampling data Sd indicating respective measurement results (count values Ct) in a plurality of sampling processes executed in one control period Sct in one data frame, and transmits the plurality of sampling data Sd to the PLC 20 (control device) in every control period Sct. The counter unit 10 includes an acquisition part 120 and a compression part 130. The acquisition part 120 acquires respective measurement results (for example, the respective count values Ct(1) to Ct(n)) in a plurality of (for example, n) executed sampling processes. In a case where the maximum Vmax of a change between measurement results (for example, a count value Ct(m) and a count value Ct(m−1)) in two sampling processes executed consecutively in one control period Sct is determined in advance, the compression part 130 executes the following compression process. That is, the compression part 130 compresses the respective measurement results in the second and subsequent sampling processes to the sampling data Sd with a size that can represent "the maximum Vmax of a change between the measurement results in the two sampling processes executed consecutively in one control period Sct".

Here, as described above, the "compression size" is a "data size (number of bits) sufficient to represent a measurement result that is changeable in one sampling period Smc". In other words, the "compression size" is a size (number of bits) that can represent "the maximum Vmax of the change between the measurement results in the two sampling processes consecutively executed in one control period Sct".

That is, in a case where the compression size is determined in advance, the compression part 130 compresses the count values Ct(2) to Ct(n) to sampling data Sd(2) to Sd(n) with compression sizes, respectively.

According to the above configuration, in a case where the maximum Vmax is determined in advance, the counter unit 10 compresses each of the pieces of sampling data Sd(2) to Sd(n) to a data size (that is, a compression size) by which the maximum Vmax can be represented and transmits the pieces of sampling data Sd(2) to Sd(n) to the PLC 20.

Therefore, it is possible to achieve an effect that the counter unit 10 can suppress a data size of a data frame transmitted to the PLC 20 in every control period Set compared with a case where each of the count values Ct(2) to Ct(n) is transmitted without being compressed.

Here, in a case where the change may be either positive or negative, for example, in a case where a range of the change is "–127" or more and "127" or less, 8 bits obtained by adding 1 bit to 7 bits by which "127" can be represented, that is, 1 byte is a data size by which the maximum Vmax can be represented. Similarly, for example, in a case where a range of the change is "–1" or more and "1" or less, 2 bits obtained by adding 1 bit to 1 bit by which "1" can be represented is a data size by which the maximum Vmax can be represented.

In a case where the change is always positive or always negative, for example, in a case where a range of the change is "0" or more and "255" or less, 8 bits by which "255" can be represented, that is, 1 byte is a data size by which the maximum Vmax can be represented. Similarly, for example, in a case where the range of the change is "0" or more and "1" or less, 1 bit by which "1" can be represented is a data size by which the maximum Vmax can be represented.

In the counter unit 10, the sampling process is a process of counting the number of pulses of a pulse signal, and a measurement result in the sampling process is the counted number of pulses that is counted (that is, the count value Ct).

According to the above configuration, in a case where the maximum Vmax is determined in advance, the counter unit 10 compresses the sampling data Sd indicating the count value Ct measured in each of the second and subsequent sampling processes to a data size by which the maximum Vmax can be represented. That is, in a case where the maximum Vmax is determined in advance, the counter unit 10 compresses each of the pieces of sampling data Sd(2) to Sd(n) respectively indicating the count values Ct(2) to Ct(n) to a compression size.

Here, in the sampling process of counting the number of pulses of a pulse signal, the number of pulses that are measurable in one sampling process is determined in advance, that is, in a case where the sampling process is a process of counting the number of pulses, the maximum Vmax is determined in advance.

More specifically, the number of pulse signals receivable by the counter unit 10 from "a pulse signal generation device such as the encoder 40 or a flow meter that generates a pulse signal according to a detection amount" in one sampling process is determined in advance. For example, in a case where pulse signals from the encoder 40 are counted, the number of pulse signals receivable by the counter unit 10 per unit time is determined in advance based on a resolution and a rotation speed (maximum rotation speed) of the encoder 40. The maximum rotation speed may be determined based on a specification (performance) of the encoder 40, and may also be determined based on an application (usage of the encoder 40). For example, if the application is "a low-speed application in which the encoder 40 rotates at a maximum of 60 rpm (one rotation per second) at the resolution of 360", even if the encoder 40 can rotate at a higher speed in terms of specification, the maximum rotation speed may be assumed to be 60 rpm. That is, the number of pulse signals receivable by the counter unit 10 in one sampling process is determined in advance based on at least one of the specification and the application of the encoder 40 (pulse signal generation device).

Therefore, it is possible to achieve an effect that the counter unit 10 can compress the sampling data Sd indicating the count value Ct measured in each of the second and subsequent sampling processes to a data size by which the maximum Vmax can be represented and transmit the sampling data Sd to the PLC 20.

In the counter unit 10, a data size by which the maximum Vmax can be represented is determined in advance based on (1) an absolute value of the number of pulses countable in one sampling process and (2) whether a pulse count method in the sampling process is bidirectional or unidirectional.

According to the above configuration, in the counter unit 10, a data size by which the maximum Vmax can be represented is determined in advance based on (1) the absolute value of the number of pulses that are countable in one sampling process and (2) the pulse count method.

In a case where the pulse count method is bidirectional, the change between the measurement results in the two sampling processes executed consecutively in one control period Sct may be positive or negative. For example, in a case where "an absolute value of the number of pulses countable in one sampling process" is "127", the change between the measurement results in the two sampling processes executed consecutively in one control period Sct may be indicated as "–127 to 127". Therefore, a data size by which the maximum Vmax can be represented is the number of bits obtained by adding 1 bit to the number of bits by which "the absolute value of the number of pulses countable in one sampling process" can be represented.

In a case where the pulse count method is unidirectional, the change between the measurement results in the two sampling processes executed consecutively in one control period Sct is always positive or always negative. For example, in a case where "an absolute value of the number of pulses countable in one sampling process" is "255", the change between the measurement results in the two sampling processes executed consecutively in one control period Sct may be indicated as "0 to 255". Therefore, a data size by which the maximum Vmax can be represented is the number of bits by which "the absolute value of the number of pulses countable in one sampling process" can be represented.

Therefore, the maximum Vmax is determined in advance, and thus it is possible to achieve an effect that the counter unit 10 can compress the sampling data Sd indicating the count value Ct measured in each of the second and subsequent sampling processes to a data size by which the maximum Vmax can be represented.

In the counter unit 10, the compression part 130 extracts a bit string for the number of bits by which the maximum Vmax can be represented, including the least significant bit, from a bit string indicating a measurement result in each of the second and subsequent sampling processes, and sets the extracted bit string as the sampling data Sd. For example, the compression part 130 extracts "bit strings for the compression size including the least significant bit" from "bit strings respectively indicating the count values Ct(2) to Ct(n)", and stores the extracted bit strings in data frames as the pieces of sampling data Sd(2) to Sd(n).

According to the above configuration, the counter unit 10 sets, as the sampling data Sd, a bit string for the number of bits by which the maximum Vmax can be represented, including the least significant bit, and extracted from a bit string indicating a measurement result in each of the second and subsequent sampling processes.

It is obvious that compared with a data size of a bit string indicating a measurement result in each of the second and subsequent sampling processes, a data size of "a bit string for the number of bits by which the maximum Vmax can be represented, including the least significant bit", and extracted from the bit string is small.

Therefore, it is possible to achieve an effect that the counter unit 10 can compress a bit string indicating a measurement result in each of the second and subsequent sampling processes to "a bit string for the number of bits by which the maximum Vmax can be represented, including the least significant bit", and extracted from the bit string.

For example, in a case where a bit string indicating each measurement result in the sampling process has a size of 4 bytes, and thus a range of the change is "−127" or more and "127" or less, the data size by which the maximum Vmax can be represented is 1 byte, and the counter unit 10 performs the following compression. That is, the counter unit 10 compresses a 4-byte bit string indicating the measurement result in each of the second and subsequent sampling processes to 1-byte sampling data Sd.

Similarly, in a case where a range of the change is "−1" or more and "1" or less, a data size by which the maximum Vmax can be represented is 2 bits, and thus the counter unit 10 compresses a 4-byte bit string indicating the measurement result in each of the second and subsequent sampling processes to 2-bit bit string. In a case where a range of the change is "0" or more and "1" or less, a data size by which the maximum Vmax can be represented is 1 bit, and thus the counter unit 10 compresses a 4-byte bit string indicating each of the measurement results in the second and subsequent sampling processes to 1-bit sampling data.

The counter unit 10 and the like of which the outlines have been described hitherto will be described next with reference to FIG. 1 for details of the configuration thereof, and then a process executed by the counter unit 10 will be described with reference to FIG. 6.

(Details of Counter Unit)

FIG. 1 is a block diagram illustrating main part configurations of the counter unit 10 and the like included in the control system 1. As illustrated in FIG. 1, the counter unit 10 includes a measurement part 110, the acquisition part 120, the compression part 130, and a transmission part 140 as functional blocks.

The measurement part 110 receives a pulse signal generated by a pulse signal generation device from a measurement device such as the encoder 40 (pulse signal generation device), and executes a sampling process of counting the number of pulses (count value Ct) of the received pulse signal. The measurement part 110 executes a plurality of (for example, n) sampling processes in one control period Sct, and notifies the acquisition part 120 of the count value Ct (for example, the count values Ct(1) to Ct(n)) measured in each sampling process.

The transmission part 140 repeatedly transmits a data frame to the PLC 20 in every control period Sct. A plurality of pieces of sampling data Sd each indicating the "count value Ct measured in each sampling process", is stored in the data frame transmitted by the transmission part 140 to the PLC 20 in every control period Sct. For example, the sampling data Sd(1) to Sd(n) respectively indicating "the count values Ct(1) to Ct(n) measured in the first to n-th sampling processes" are stored in the data frame.

The acquisition part 120 stores a bit string indicating the count value Ct(1) measured in the first sampling process in the data frame as the sampling data Sd(1) for the count value Ct acquired from the measurement part 110. The acquisition part 120 transfers the bit string indicating the count value Ct measured in each of the second and subsequent sampling processes to the compression part 130, and transfers, for example, a bit string indicating each of the count values Ct(2) to Ct(n) to the compression part 130.

The compression part 130 compresses "the bit string indicating the count value Ct measured in each of the second and subsequent sampling processes" acquired from the acquisition part 120 to a bit string with a "compression size". The compression part 130 stores each of a plurality of bit strings compressed to the "compression size" in the data frame as the sampling data Sd indicating "the count value Ct measured in each of the second and subsequent sampling processes".

Specifically, the compression part 130 compresses a bit string indicating the count value Ct(2) to a bit string with the "compression size" and stores the count value Ct(2) in the data frame as the sampling data Sd(2). The compression part 130 compresses a bit string indicating the count value Ct(3) to a bit string with the "compression size" and stores the count value Ct(3) in the data frame as the sampling data Sd(3). Similarly, the compression part 130 compresses a bit string indicating the count value Ct(n) to a bit string with the "compression size" and stores the count value Ct(n) in the data frame as the sampling data Sd(n).

The compression part 130 may compress "the bit string indicating the count value Ct measured in each of the second and subsequent sampling processes" by using the "compression size" set in advance by the tool 30.

The "compression size" is a data size (number of bits) sufficient to represent the "count value Ct that is changeable in one sampling period Smc". In other words, the "count value Ct that is changeable in one sampling period Smc" is "the maximum Vmax of the count value Ct countable by the measurement part 110 during one sampling period Smc (that is, a range of a count value Ct countable in one sampling process). That is, the "count value Ct that is changeable in one sampling period Smc" is the "maximum Vmax of a change between the count values Ct counted in two sampling processes executed consecutively during one control period Sct". Therefore, the "compression size" is the number of bits by which "the maximum Vmax of the change between the count values Ct counted by the measurement part 110 in the two sampling processes executed consecutively in one control period Sct" can be represented.

The "count value Ct that is changeable in one sampling period Smc", that is, the maximum Vmax is determined by "an absolute value of the number of pulses countable by the measurement part 110 in one sampling process" and "a pulse count method in the measurement part 110".

The "absolute value of the number of pulses countable in one sampling process" may be calculated by rounding up digits after the decimal point of "a value that is obtained by dividing the sampling period Smc by the shortest period of the pulse signal (shortest pulse period Plcmin)".

In a case where the pulse count method of the measurement part 110 is bidirectional, a change from the count value Ct(m−1) of the (m−1)-th sampling process to the count value Ct(m) of the m-th sampling process may be either positive or negative. For example, in a case where "an absolute value of the number of pulses countable in one sampling process" is "127", the maximum Vmax of the change from the count value Ct(m−1) to the count value Ct(m), that is, the maximum Vmax may be indicated as "−127 to 127".

Therefore, in a case where the pulse count method of the measurement part 110 is bidirectional, the number of bits obtained by adding 1 bit to the number of bits by which "the absolute value of the number of pulses countable in one sampling process" can be represented is a "compression size".

In a case where the pulse count method of the measurement part 110 is unidirectional, the change from the count value Ct(m−1) to the count value Ct(m) is always positive or always negative. For example, in a case where "the absolute value of the number of pulses countable in one sampling process" is "255", the maximum Vmax of the change from the count value Ct(m−1) to the count value Ct(m) is, that is, the maximum Vmax may be indicated as "0 to 255".

Therefore, in a case where the pulse count method of the measurement part 110 is unidirectional, the number of bits by which "the absolute value of the number of pulses countable in one sampling process" can be represented is a "compression size".

For example, the compression part 130 extracts "a bit string for the compression size including the least significant bit" as a lower bit string Lb from "a bit string indicating the count value Ct measured in each of the second and subsequent sampling processes". The compression part 130 stores the extracted lower bit string Lb in a data frame as the sampling data Sd.

For example, in a case where the compression size is 1 byte, the compression part 130 extracts lower bit strings Lb(2) to Lb(n) each of which is "a bit string for 1 byte including the least significant bit" from bit strings respectively indicating the count values Ct(2) to Ct(n). The compression part 130 stores the extracted lower bit strings Lb(2) to Lb(n) in a data frame as the pieces of sampling data Sd(2) to Sd(n).

In the following description, the "bit string for the compression size including the least significant bit" of the bit string indicating the count value Ct is referred to as a lower bit string Lb of the bit string indicating the count value Ct. A bit string other than the "bit string for the compression size including the least significant bit" in the bit string indicating the count value Ct will be referred to as an upper bit string Hb of the bit string indicating the count value Ct. That is, the upper bit string Hb of the count value Ct is a bit string other than the lower bit string Lb of the bit string indicating the count value Ct.

3. Operation Example

Figure 6:
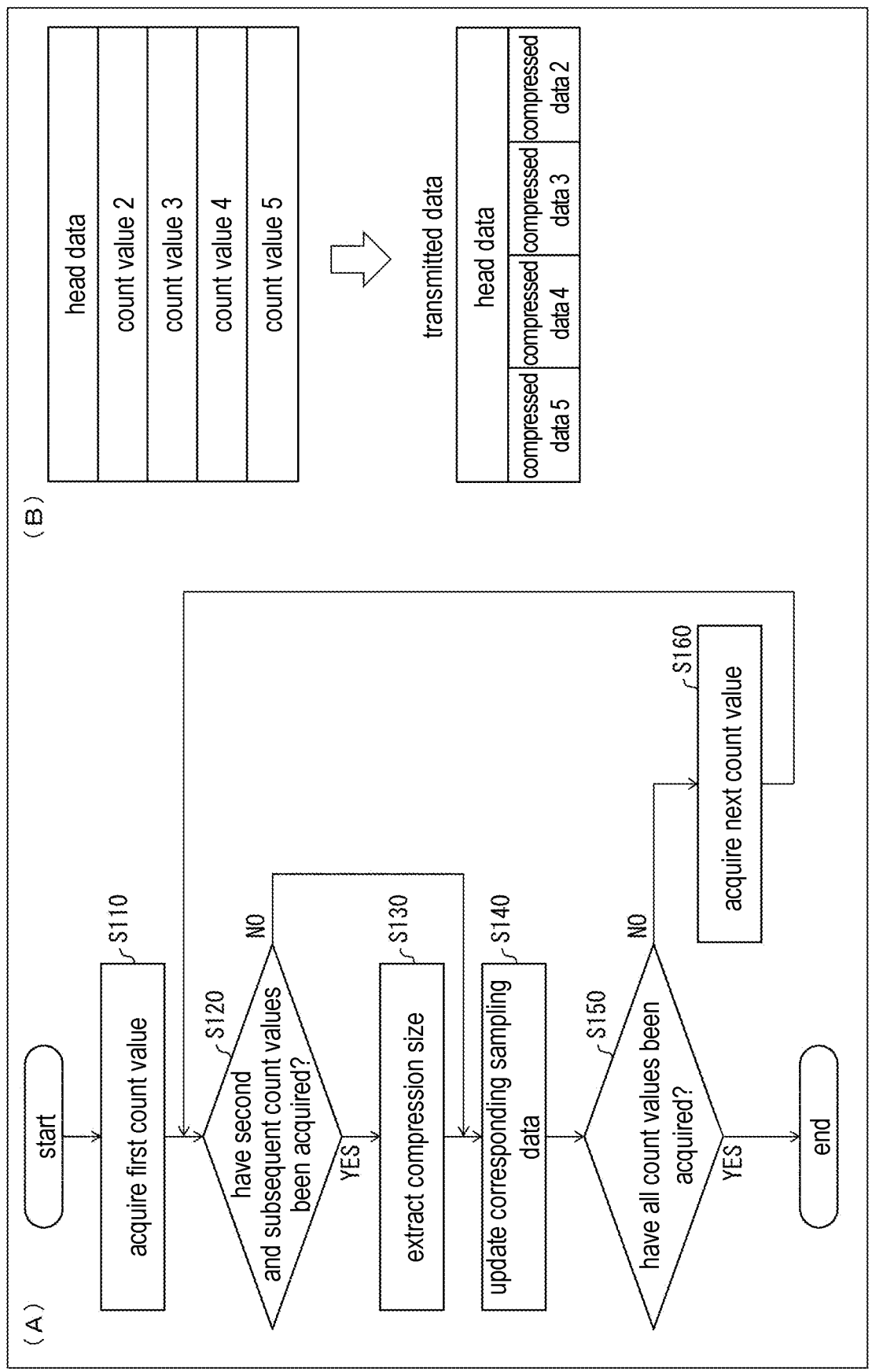
FIG. 6 is a diagram illustrating an outline of a process executed by the counter unit in FIG. 1.

FIG. 6 is a diagram illustrating an outline of a process executed by the counter unit 10, and in particular, (A) of FIG. 6 is a flowchart illustrating an example of a data compression process executed by the counter unit 10. The acquisition part 120 acquires the count value Ct(1) counted in the first sampling process executed by the measurement part 110 in one control period Sct from the measurement part 110 (S110). The acquisition part 120 determines whether or not the count value Ct(p) (where "p" is an integer of "1" or greater and "n" or smaller) acquired from the measurement part 110 is the second and subsequent count values Ct(2) to Ct(n) (S120).

In a case where it is determined that the count value Ct(p) acquired from the measurement part 110 is not the second and subsequent count values Ct(2) to Ct(n), that is, the count value Ct(1) has been acquired (No in S120), the acquisition part 120 executes the following process. That is, the acquisition part 120 stores a bit string indicating the count value Ct(1) without being compressed as the sampling data Sd(1) in a data frame, that is, updates the sampling data Sd(1) to the bit string indicating the count value Ct(1) (S140).

In a case where it is determined that the count value Ct(p) acquired from the measurement part 110 is any of the second and subsequent count values Ct(2) to Ct(n) (Yes in S120), the acquisition part 120 outputs the acquired count value Ct(p) to the compression part 130. The compression part 130 extracts, as the "lower bit string Lb(p)", "a bit string for the compression size including the least significant bit" from the count value Ct(p) (more specifically, "the bit string indicating the count value Ct(p)") acquired from the acquisition part 120 (S130). The compression part 130 stores the lower bit string Lb(p) extracted from the count value Ct(p) as the sampling data Sd(p) in the data frame, that is, updates the corresponding sampling data Sd(p) to the lower bit string Lb(p) (S140).

The acquisition part 120 determines whether all the count values Ct(1) to Ct(n) have been acquired from the measurement part 110 (S150). In a case where it is determined that all the count values Ct(1) to Ct(n) have been acquired (Yes in S150), the acquisition part 120 finishes the process. In a case where it is determined that all the count values Ct(1) to Ct(n) have not been acquired (No in S150), the acquisition part 120 acquires the next count value Ct(p+1) from the measurement part 110 (S160).

As illustrated in (B) of FIG. 6, the process illustrated in (A) of FIG. 6 is executed, and thus the counter unit 10 generates the data frame in which only the sampling data Sd(1) has the full size and each of the pieces of sampling data Sd(2) to Sd(n) has the compression size.

The processes executed by the counter unit 10 (in other words, a control method executed by the counter unit 10) described so far with reference to FIG. 6 may be summarized as follows. That is, the process (control method) executed by the counter unit 10 is a control method for a data transfer device that stores a plurality of pieces of sampling data Sd indicating respective measurement results (for example, the count values Ct) in a plurality of sampling processes executed in one control period Sct in one data frame and transmits the sampling data Sd to the PLC 20 in every control period Sct. The process executed by the counter unit 10 includes the acquisition step (S110 and S160) of acquiring a measurement result (for example, each of the count values Ct(1) to Ct(n)) in each of a plurality of (for example, n) executed sampling processes; and the compression step (S130) of compressing each of measurement results in the second and subsequent sampling processes among a plurality of the measurement results acquired to the sampling data Sd with a data size by which the maximum Vmax can be represented in the acquisition step in a case where the maximum Vmax of a change between the measurement results in two of the sampling processes executed consecutively in one control period Sct is determined in advance.

According to the above configuration, in the control method, in a case where the maximum Vmax is determined in advance, the sampling data Sd indicating each of the measurement results in the second and subsequent sampling processes is compressed to a data size (that is, a compression size) by which the maximum Vmax can be represented and transmitted to the PLC 20. That is, in the control method, in a case where the maximum Vmax is determined in advance, the pieces of sampling data Sd(2) to Sd(n) respectively indicating the count values Ct(2) to Ct(n) are compressed to the data size by which the maximum Vmax can be represented and transmitted to the PLC 20.

Therefore, it is possible to achieve an effect that the control method can suppress a data size of a data frame transmitted to the PLC 20 in every control period Sct compared with a case where each of measurement results in the second and subsequent sampling processes is not compressed.

Here, in a case where the change may be either positive or negative, for example, in a case where a range of the change is "−127" or more and "127" or less, 8 bits obtained by adding 1 bit to 7 bits by which "127" can be represented, that is, 1 byte is a data size by which the maximum Vmax can be represented. Similarly, for example, in a case where a range of the change is "−1" or more and "1" or less, 2 bits obtained by adding 1 bit to 1 bit by which "1" can be represented is a data size by which the maximum Vmax can be represented.

In a case where the change is always positive or always negative, for example, in a case where a range of the change is "0" or more and "255" or less, 8 bits by which "255" can be represented, that is, 1 byte is a data size by which the maximum Vmax can be represented. Similarly, for example, in a case where the range of the change is "0" or more and "1" or less, 1 bit by which "1" can be represented is a data size by which the maximum Vmax can be represented.

(Outline of Data Frame)

Figure 7:
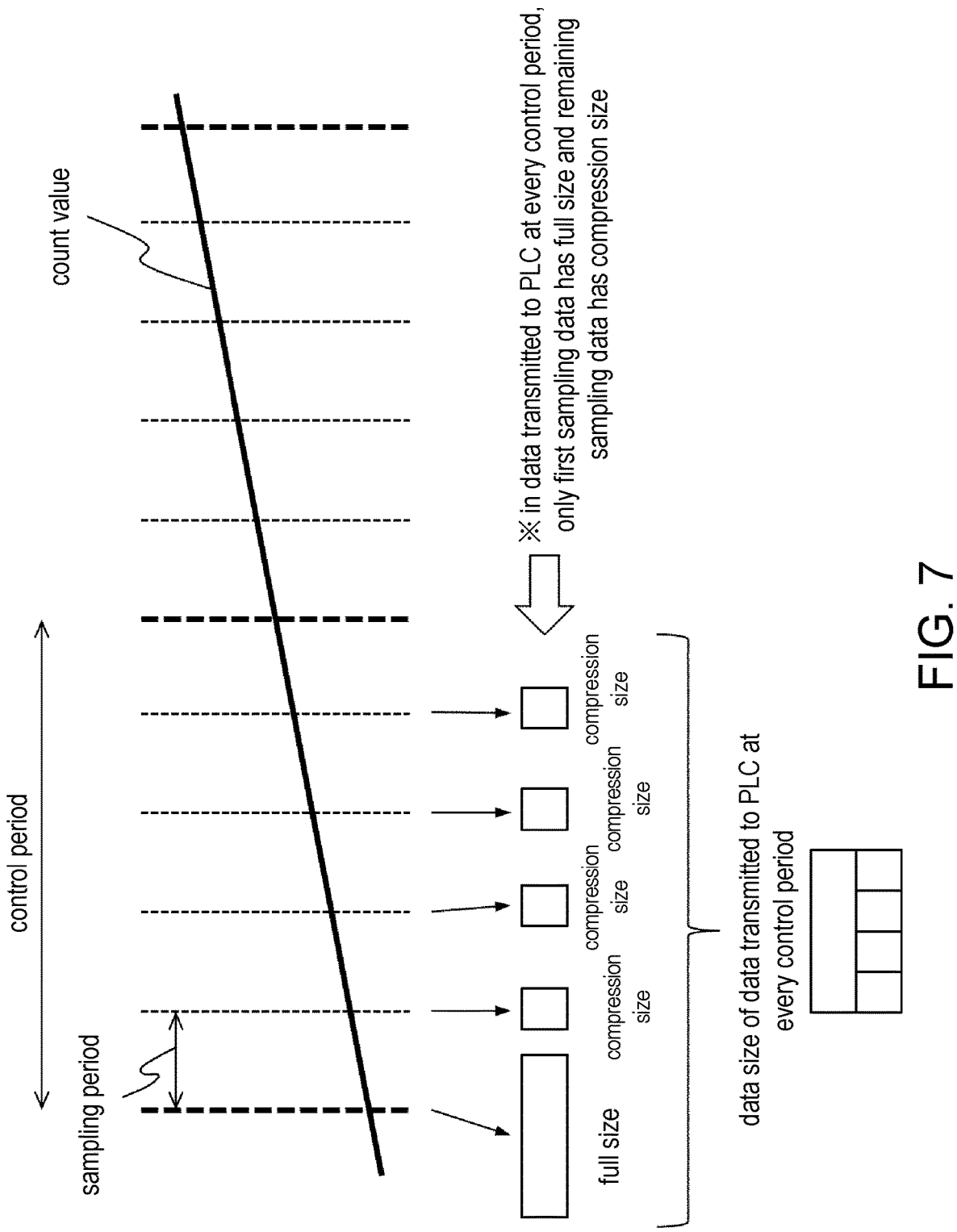
FIG. 7 is a diagram illustrating an outline of a data frame transferred in every control period in the control system in FIG. 2.

FIG. 7 is a diagram illustrating an outline of a data frame repeatedly transmitted by each of the counter unit 10 and the analog unit 60 to the PLC 20 in every control period Sct. In a data frame transmitted by the transmission part 140 to the PLC 20 in every control period Sct, only the first sampling data Sd(1) has a full size, and each of the remaining pieces of sampling data Sd(2) to Sd(n) has a compression size.

For example, the measurement part 110 executes n sampling processes in one control period Sct. The measurement part 110 generates the count value Ct(1) in the first sampling process, the count value Ct(2) in the second sampling process, and the count value Ct (3) in the third sampling process. Similarly, the measurement part 110 generates the count value Ct(n) in the n-th sampling process.

That is, the measurement part 110 generates n count values Ct including the count value Ct(1) to the count value Ct(n) respectively corresponding to sampling processes through n sampling processes executed in one control period Sct. The counter unit 10 generates the sampling data Sd(1) to the sampling data Sd(n) respectively corresponding to the count value Ct(1) to the count value Ct(n).

The counter unit 10 uses only the sampling data Sd(1) as data with a full size, and generates the remaining sampling data Sd (that is, each of the sampling data Sd(2) to the sampling data Sd(n)) as data with a compression size. The counter unit 10 (in particular, the transmission part 140) repeatedly transmits a data frame storing n pieces of sampling data Sd including the sampling data Sd(1) to the sampling data Sd(n) to the PLC 20 in every control period Sct.

(Compression Size)

Figure 8:
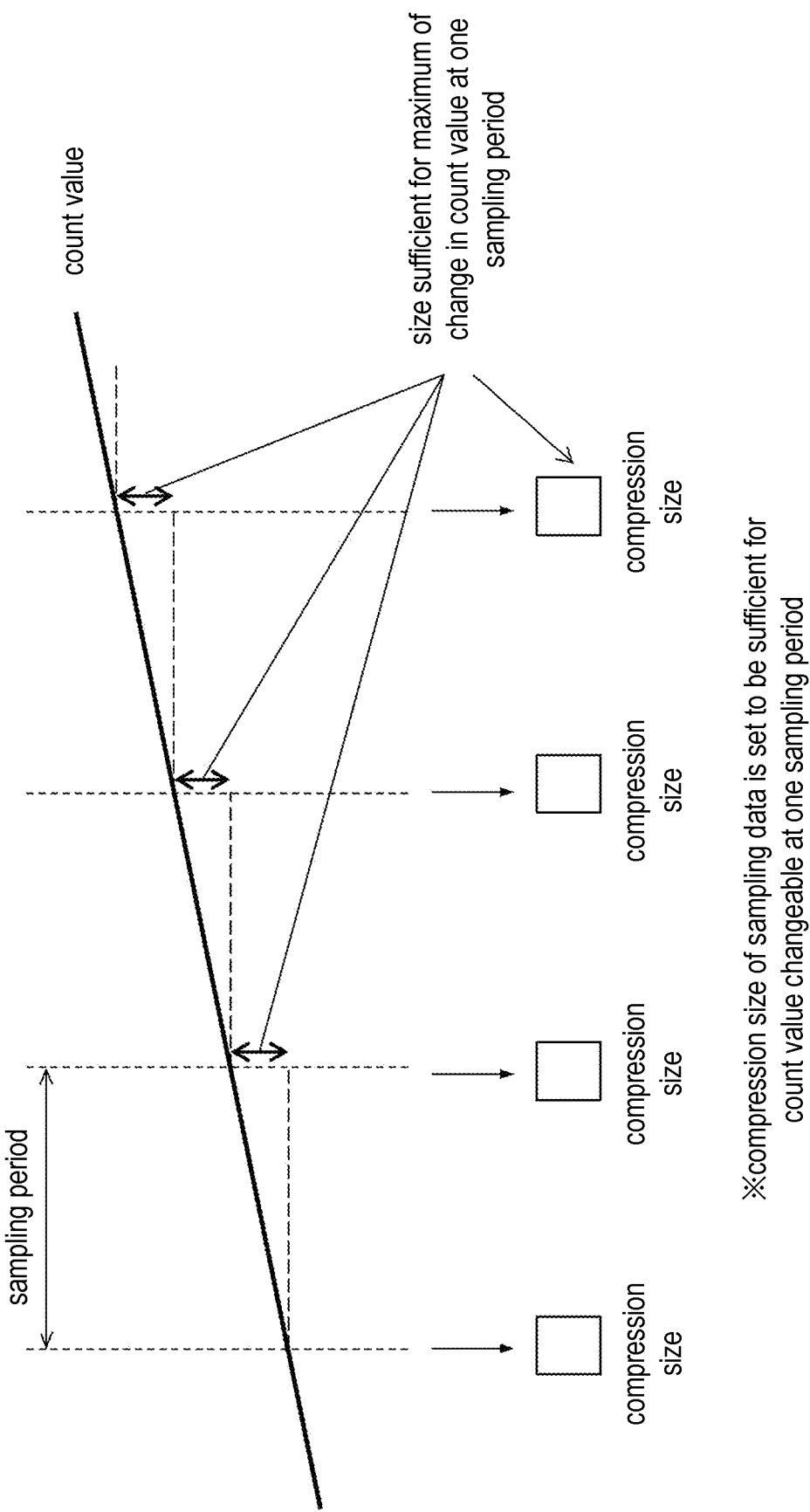
FIG. 8 is a diagram for describing a data size of sampling data indicating measurement results measured in second and subsequent sampling processes.

FIG. 8 is a diagram for describing a data size, that is, a compression size of each of the pieces of sampling data Sd(2) to Sd(n) transmitted to the PLC 20 by each of the counter unit 10 and the analog unit 60 in every control period Sct.

The compression size of each of the pieces of sampling data Sd(2) to Sd(n) respectively indicating the count values Ct(2) to Ct(n) counted by the measurement part 110 in every sampling period Smc is set to be sufficient to represent the count value Ct that is changeable in one sampling period Smc. That is, the compression size is a data size by which the maximum Vmax of a change between two count values Ct respectively counted in two sampling processes executed consecutively by the measurement part 110 in one control period Sct can be represented. In other words, the compression size is a data size by which the maximum Vmax of the change between the count value Ct(m) measured in the "m"-th sampling process and the count value Ct(m−1) measured in the "m−1"-th sampling process executed immediately before that can be represented.

In a case where a range of the change in the count value Ct that is changeable in one sampling period Smc, that is, the maximum Vmax is, for example, "−127" or more and "127" or less, 8 bits (=1 byte) obtained by adding 1 bit to 7 bits by which "127" can be represented is a compression size. Similarly, in a case where a range of the change in the count value Ct that is changeable in one sampling period Smc is, for example, "−1" or more and "1" or less, 2 bits obtained by adding 1 bit to 1 bit by which "1" can be represented is a compression size. In a case where a range of the change in the count value Ct that is changeable in one sampling period Smc is, for example, "0" or more and "255" or less, 8 bits (=1 byte) by which "255" can be represented is a compression size.

(Absolute Value of Number of Pulses Countable in One Sampling Period)

Figure 9:
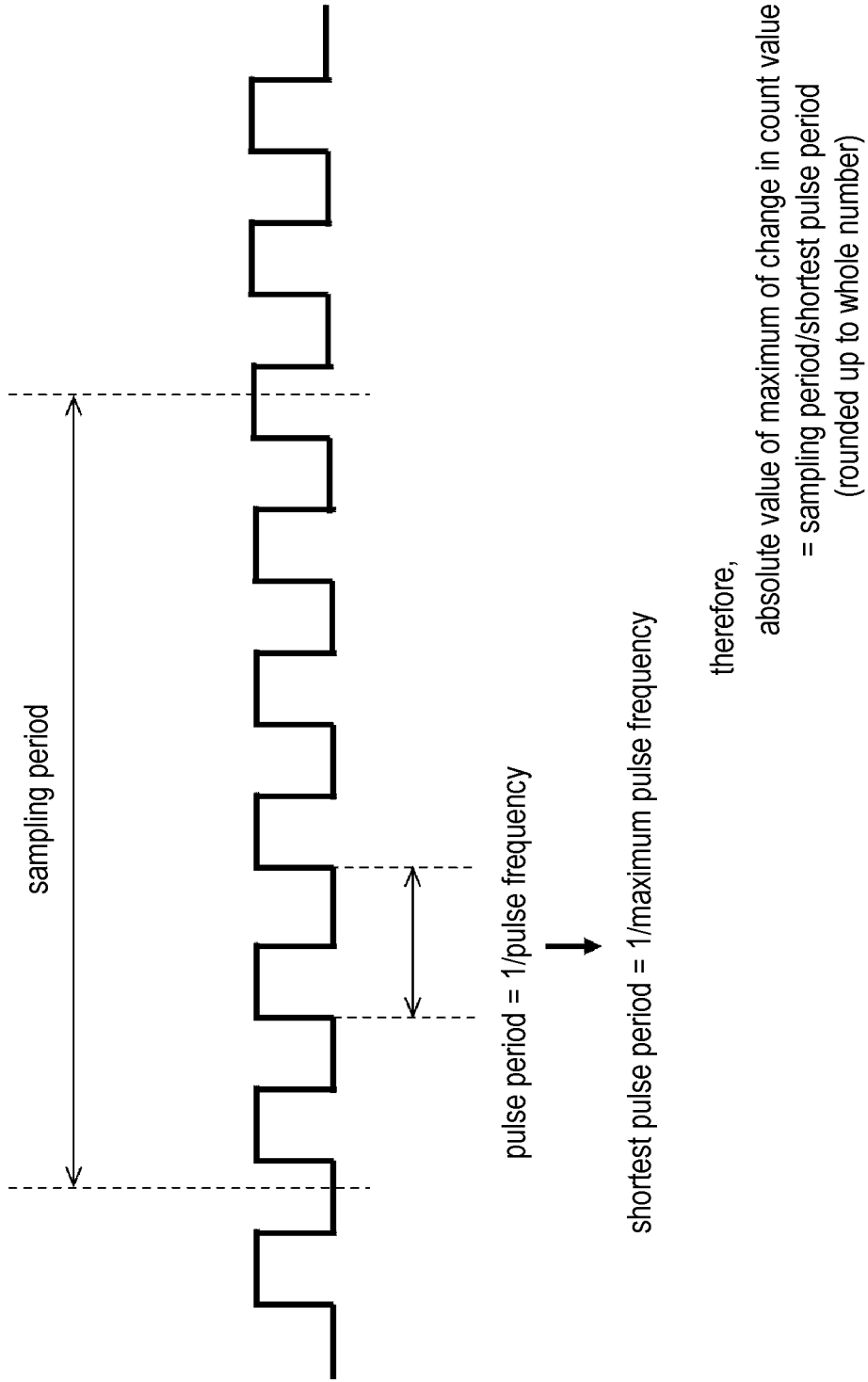
FIG. 9 is a diagram for describing an absolute value of a measurement result that can be measured in one sampling process.

FIG. 9 is a diagram for describing "an absolute value of the number of pulses countable by the counter unit 10 (in particular, the measurement part 110) in one sampling period Smc". Even if the pulse count method of the measurement part 110 is bidirectional, the number of pulses counted by the measurement part 110 changes only by "1" (or by "−1") each time a pulse signal is received.

Therefore, "the absolute value of the number of pulses countable in one sampling process" is determined based on the sampling period Smc and the maximum frequency (maximum pulse frequency) of a pulse signal. That is, since a "pulse period Plc" is "1/pulse frequency", the "shortest pulse period Plcmin" is "1/maximum pulse frequency". Therefore, "the absolute value of the number of pulses countable in one sampling process" is "a value obtained by dividing the sampling period Smc by the shortest pulse period Plcmin (rounded up to a whole number)".

(Number of Bits Required for Compression Data)

Figure 10:
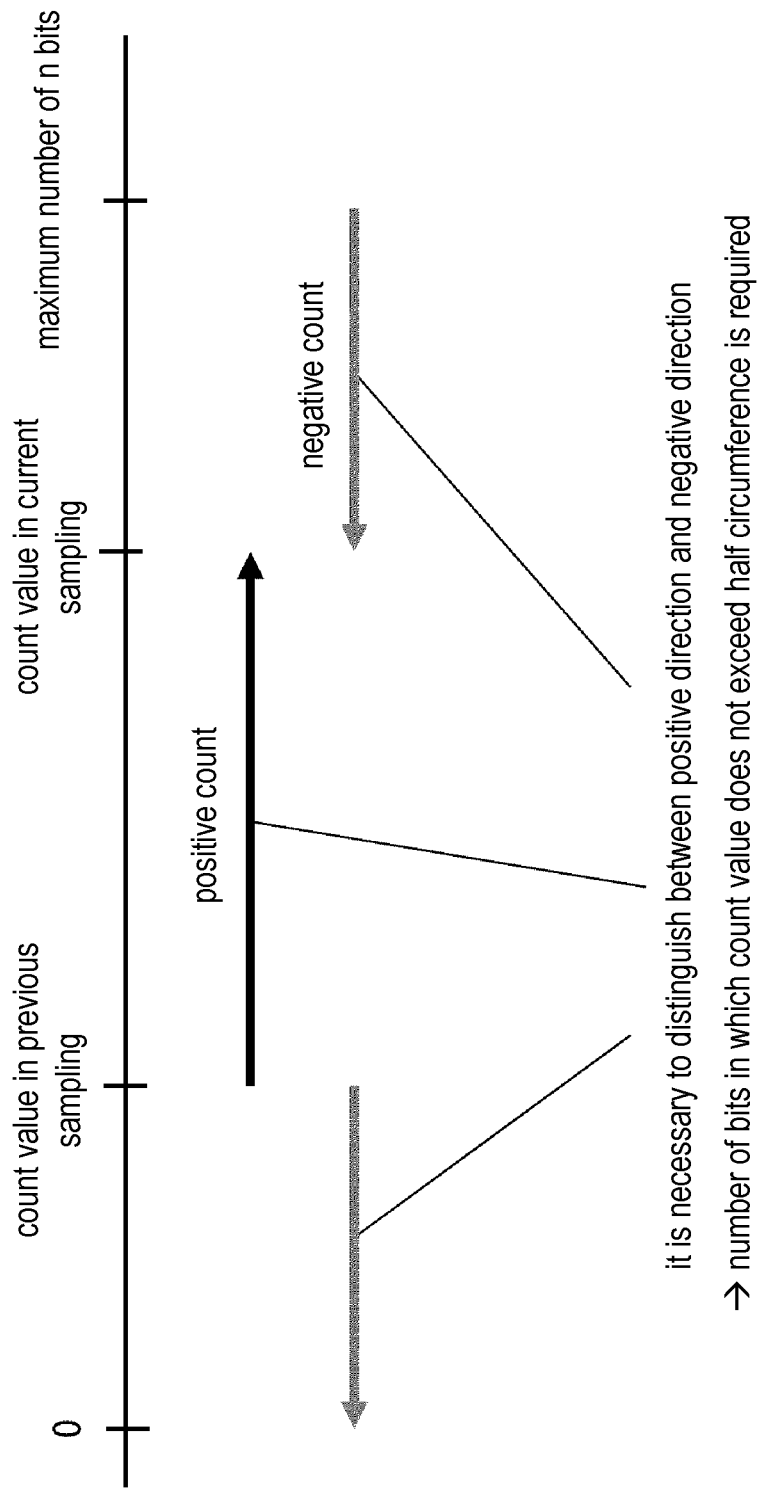
FIG. 10 is a diagram for describing a measurement result that can be measured in one sampling process.

FIG. 10 is a diagram for describing the maximum Vmax of the count value Ct countable by the counter unit 10 (in particular, the measurement part 110) in one sampling period Smc. In a case where the pulse count method of the measurement part 110 has a positive direction and a negative direction, that is, in a case where the pulse count method is bidirectional, the number of bits by which "the maximum Vmax of the count value Ct countable in one sampling period Smc" can be represented is as follows. That is, the number of bits by which the maximum Vmax of the count value Ct countable in one sampling period Smc can be represented is the number of bits obtained by adding 1 bit to the number of bits by which "an absolute value of the number of pulses countable in one sampling process" can be represented. This is because, in addition to the number of bits by which "the absolute value of the number of pulses countable in one sampling process" can be represented, 1 bit for distinguishing between the positive direction and the negative direction is required. Therefore, the number of bits in which "the absolute value of the number of pulses countable in one sampling process" does not exceed a half circumference (half) is required as the compression size.

In a case where the pulse count method of the measurement part 110 is unidirectional, the "maximum Vmax of the count value Ct countable in one sampling period Smc" is always positive or always negative. Therefore, the number of bits by which the maximum Vmax of the count value Ct countable in one sampling period Smc can be represented is the number of bits by which "the absolute value of the number of pulses countable in one sampling process" can be represented.

(Specific Example of Required Number of Bits)

In a case where the pulse count method of the measurement part 110 is bidirectional, if the absolute value of the number of pulses countable by the measurement part 110 in one sampling period Smc is "127", the maximum Vmax is "−127" or more and "127" or less, and can thus be represented by 1 byte. Therefore, if the pulse count method is bidirectional and the absolute value of the number of pulses countable in one sampling period Smc is "127", the compression size is 1 byte.

Similarly, if the pulse count method is bidirectional and the absolute value of the number of pulses countable in one sampling period Smc is "32767", the compression size is 2 bytes. If the pulse count method is bidirectional and the absolute value of the number of pulses countable in one sampling period Smc is "1", the compression size is 2 bits.

In a case where the pulse count method of the measurement part 110 is unidirectional, if the absolute value of the number of pulses countable by the measurement part 110 in one sampling period Smc is "255", the compression size is 1 byte. If the pulse count method is unidirectional and the absolute value of the number of pulses countable in one sampling period Smc is "65535", the compression size is 2 bytes. If the pulse count method is unidirectional and the absolute value of the number of pulses countable in one sampling period Smc is "3", the compression size is 2 bits. If the pulse count method is unidirectional and the absolute value of the number of pulses countable in one sampling period Smc is "1", the compression size is 1 bit.

(Details of PLC)

As illustrated in FIG. 1, the PLC 20 includes a data frame reception part 210 and a restoring part 220 as functional blocks. The PLC 20 may include an instruction part that controls the control system 1 in addition to the above-described functional blocks, but in order to simplify the description, a constituent that is not directly related to the present embodiment is omitted from the description and the block diagram. However, the PLC 20 may have the omitted constituent according to an actual situation of implementation. The data frame reception part 210 and the restoring part 220 may be realized, for example, by a central processing unit (CPU) reading a program stored in a storage device implemented by a read only memory (ROM), a non-volatile random access memory (NVRAM), or the like to a random access memory (RAM) (not illustrated) and executing the program. Hereinafter, the data frame reception part 210 and the restoring part 220 in the PLC 20 will be described.

The data frame reception part 210 repeatedly receives a data frame transmitted from the counter unit 10 (in particular, the transmission part 140 of the counter unit 10) in every control period Set. The data frame reception part 210 extracts the pieces of sampling data Sd(2) to Sd(n) compressed to the compression size from the data frame received from the counter unit 10, and outputs each of the pieces of sampling data Sd(2) to Sd(n) to the restoring part 220. The data frame reception part 210 may extract the sampling data Sd(1) not compressed to the compression size from the data frame received from the counter unit 10, and stores the sampling data Sd(1) without being compressed in a count value table (not illustrated).

The restoring part 220 restores the pieces of sampling data Sd(2) to Sd(n) acquired from the data frame reception part 210 and compressed to the compression size to the count values Ct(2) to Ct(n), respectively. The restoring part 220 uses, for example, the compression size reported (set) from the tool 30 to restore the count values Ct(2) to Ct(n) from the respective pieces of sampling data Sd(2) to Sd(n). The restoring part 220 may use, for example, the compression size reported from the counter unit 10 to restore the count values Ct(2) to Ct(n) from the respective pieces of sampling data Sd(2) to Sd(n).

The PLC 20 including the data frame reception part 210 and the restoring part 220 restores respective measurement results (that is, the count values Ct(2) to Ct(n)) in the second and subsequent sampling processes from the respective pieces of Sd(2) to Sd(n) compressed to the compression size.

Therefore, it is possible to achieve an effect that the PLC 20 can acquire the count value Ct in each of the second and subsequent sampling processes from the sampling data Sd of which the data size is suppressed compared with a case where the data size is not compressed, in the same manner as in a case where the data size is not compressed.

In the PLC 20, the restoring part 220 restores the respective measurement results in the second and subsequent sampling processes such that an amount of change from the measurement result in the immediately preceding sampling process is equal to or less than the maximum Vmax by using a bit string indicating the measurement result in the immediately preceding sampling process and a bit string stored in the data frame as the sampling data Sd indicating each of the measurement results in the second and subsequent sampling processes. The restoring part 220 restores the count value Ct(m) such that an amount of change in the count value Ct(m) from the count value Ct(m−1) is equal to or less than the maximum Vmax by using a bit string indicating the count value Ct(m−1) and a bit string indicating the sampling data Sd(m).

According to the above configuration, the PLC 20 restores the respective measurement results in the second and subsequent sampling processes according to the following method. That is, the PLC 20 restores the respective measurement results in the second and subsequent sampling processes by using a bit string indicating the measurement result in the immediately preceding sampling process and a bit string stored in the data frame as the sampling data Sd. In this case, the PLC 20 restores "each of the measurement results in the second and subsequent sampling processes" such that an amount of change in "each of the measurement results in the second and subsequent sampling processes" to be restored from the measurement result in the immediately preceding sampling process is equal to or less than the maximum Vmax.

Therefore, it is possible to achieve an effect that the PLC 20 can accurately restore the respective measurement results in the second and subsequent sampling processes by using the bit string stored in the data frame as the sampling data Sd.

For example, first, the PLC 20 acquires the sampling data Sd(m) that is a restoration target and a bit string indicating a measurement result (count value Ct(m−1)) measured in a sampling process immediately before a sampling process in which a measurement result (count value Ct(m)) obtained by restoring the sampling data Sd(m) is measured.

Next, the PLC 20 extracts "a bit string for the number of bits by which the maximum Vmax can be represented, including the least significant bit" from the bit string indicating the count value Ct(m−1), that is, extracts the lower bit string Lb(m−1). The PLC 20 compares the extracted lower bit string Lb(m−1) with the sampling data Sd(m) that is a restoration target.

If it is determined that an amount of change in the sampling data Sd(m) that is a restoration target from "the lower bit string Lb(m−1) of the bit string indicating the count value Ct(m−1)" is equal to or less than the maximum Vmax, the PLC 20 executes the following process.

That is, the PLC 20 generates a bit string in which "the upper bit string Hb(m−1) of the bit string indicating the count value Ct(m−1)" and the "sampling data Sd(m) that is a restoration target" are combined, as a bit string indicating the measurement result (that is, the count value Ct(m)) restored from the "sampling data Sd(m) that is a restoration target". Specifically, the PLC 20 generates a bit string having "the upper bit string Hb(m−1) of the bit string indicating the count value Ct(m−1)" as upper bits and the "sampling data Sd(m) that is a restoration target" as lower bits, as the bit string indicating the restored measurement result (count value Ct(m)).

If it is determined that the sampling data Sd(m) that is a restoration target is reduced by more than the maximum Vmax from "the lower bit string Lb(m−1) of the bit string indicating the count value Ct(m−1)", the PLC 20 executes the following process.

That is, first, the PLC 20 determines that the sampling data Sd(m) that is a restoration target indicates not a value reduced from the "lower bit string Lb(m−1) of the bit string indicating the count value Ct(m−1)" but a value increased and carried up. The PLC 20 generates the bit string indicating the measurement result (count value Ct(m)) restored from the "sampling data Sd(m) that is a restoration target" by using an upper bit string Hb'(m−1) obtained by adding 1 to "the upper bit string Hb(m−1) of the bit string indicating the count value Ct(m−1)". Specifically, the PLC 20 generates a bit string having the upper bit string Hb'(m−1) as upper bits and the "sampling data Sd(m) that is a restoration target" as lower bits, as the bit string indicating the count value Ct(m).

If it is determined that the sampling data Sd(m) that is a restoration target is increased by more than the maximum Vmax from "the lower bit string Lb(m−1) of the bit string indicating the count value Ct(m−1)", the PLC 20 executes the following process.

That is, first, the PLC 20 determines that the sampling data Sd(m) that is a restoration target indicates not a value increased from "the lower bit string Lb(m−1) of the bit string indicating the count value Ct(m−1)" but a value reduced and carried down. The PLC 20 generates the bit string indicating the measurement result (count value Ct(m)) restored from the "sampling data Sd(m) that is a restoration target" by using an upper bit string Hb'(m−1) obtained by subtracting 1 from "the upper bit string Hb(m−1) of the bit string indicating the measurement result of the count value Ct(m−1)". Specifically, the PLC 20 generates a bit string having the upper bit string Hb'(m−1) as upper bits and the "sampling data Sd(m) that is a restoration target" as lower bits, as the bit string indicating the count value Ct(m).

The PLC 20 may include a PLC storage part (not illustrated) as a storage device storing various data used by the PLC 20. The PLC storage part may non-temporarily store (1) a control program executed by the PLC 20, (2) an OS program, (3) an application program for executing various functions of the PLC 20, and (4) various data read when the application program is executed. The data in the above (1) to (4) may be stored in a non-volatile storage device such as a read only memory (ROM), a flash memory, an erasable programmable ROM (EPROM), an Electrically EPROM (EEPROM) (registered trademark)), or a hard disk drive (HDD). The PLC 20 may further include a PLC temporary storage part. The PLC temporary storage part is a so-called working memory that temporarily stores data used for calculation and calculation results in the middle of various processes executed by the PLC 20, and is configured with a volatile storage device such as a random access memory (RAM). Which data is stored in which storage device is determined as appropriate based on the purpose of use, convenience, cost, physical restrictions, and the like of the PLC 20. A count value table (not illustrated) may be stored in the PLC storage part. The count values Ct(1) to Ct(n) respectively corresponding to the pieces of sampling data Sd(1) to Sd(n) are stored in the count value table.

(Process Executed by PLC: Compressed Data Restoration Process)

Figure 11:
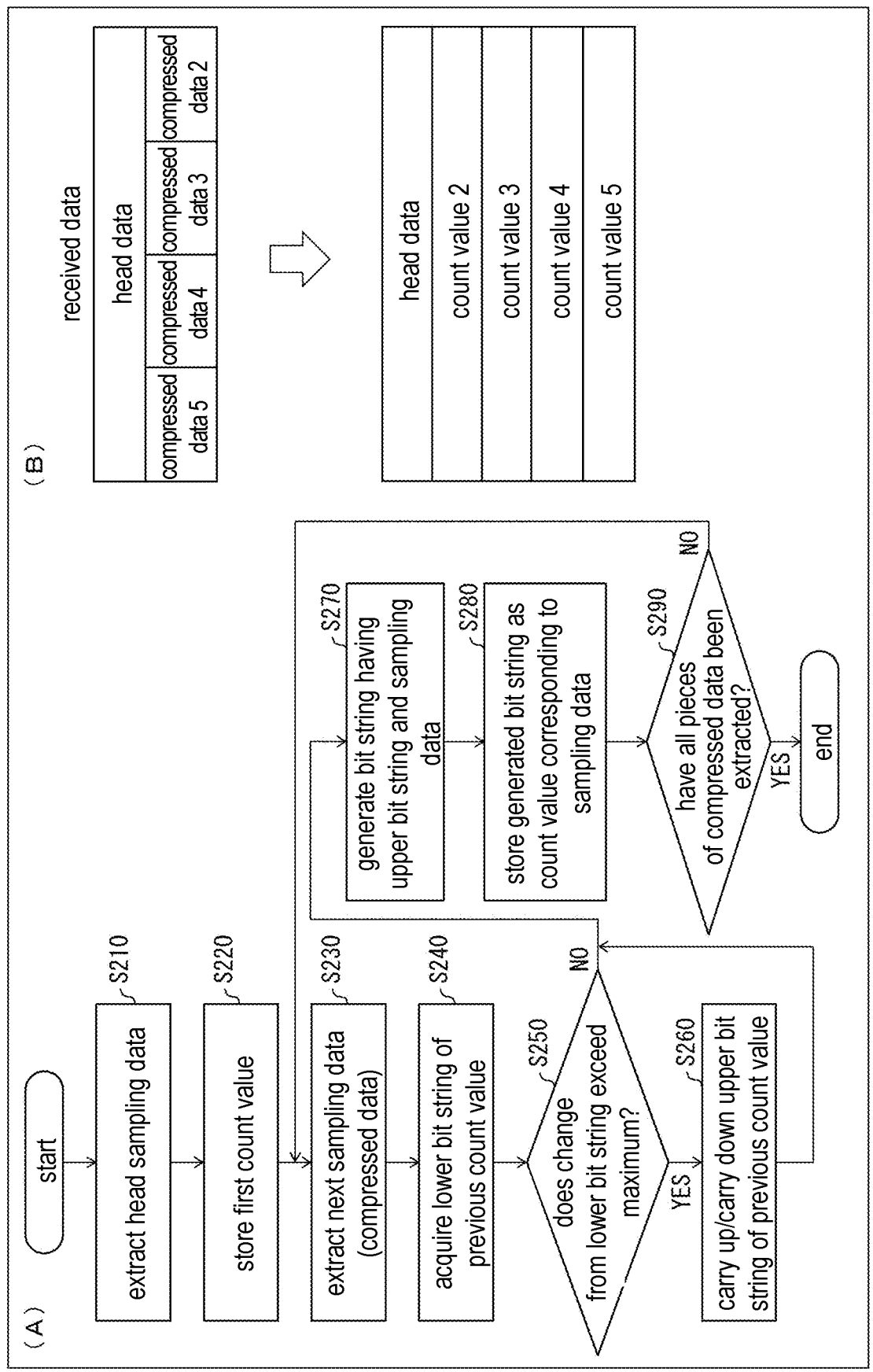
FIG. 11 is a diagram illustrating an outline of a process executed by a PLC in FIG. 1.

FIG. 11 is a diagram illustrating an outline of a process executed by the PLC 20, and in particular, (A) of FIG. 11 is a flowchart illustrating an example of a data restoration process executed by the PLC 20. In the following description, it is assumed that the PLC 20 acquires information indicating "the maximum Vmax of the count value Ct countable by the counter unit 10 in one sampling process" from at least one of the tool 30 and the counter unit 10. For example, the PLC 20 receives, from the tool 30 or the counter unit 10, information indicating that "the count value Ct (that is, the maximum Vmax) countable by the counter unit 10 in one sampling process" is "−127 to 127". The information indicating "the maximum Vmax of the count value Ct countable by the counter unit 10 in one sampling process" may be rephrased as information indicating a compression size.

The restoring part 220 extracts the head sampling data Sd(1) from the "data frame received by the data frame reception part 210" (S210), and stores the sampling data Sd(1) as the first count value Ct(1) in the count value table (S220). If the count value Ct(1) is stored in the count value table, the restoring part 220 extracts the next sampling data Sd(2) from the data frame, that is, extracts the sampling data Sd(p) as "p=2" (S230).

The restoring part 220 extracts "a bit string for the compression size including the least significant bit" from the previous count value Ct(p−1), that is, extracts the lower bit string Lb(p−1) (S240). The restoring part 220 determines whether a change in the sampling data Sd(p) from the lower bit string Lb(p−1) exceeds the maximum Vmax (S250).

In a case where it is determined that "the change in the sampling data Sd(p) from the lower bit string Lb(p−1)" exceeds the maximum Vmax (Yes in S250), the restoring part 220 executes a carry-up process or a carry-down process. Specifically, the restoring part 220 executes a carry-up process in which "1" is added to the upper bit string Hb(p−1)

of the previous count value Ct(p−1), or a carry-down process in which "1" is subtracted from the upper bit string Hb(p−1) (S260).

That is, if it is determined that the sampling data Sd(p) is reduced from the lower bit string Lb(p−1) by more than the maximum Vmax, the restoring part 220 executes the carry-up process of generating the upper bit string Hb'(p−1) obtained by adding 1 to the upper bit string Hb(p−1). If it is determined that the sampling data Sd(p) is increased from the lower bit string Lb(p−1) by more than the maximum Vmax, the restoring part 220 executes the carry-down process of generating the upper bit string Hb'(p−1) obtained by subtracting 1 from the upper bit string Hb(p−1). The restoring part 220 generates a bit string having the upper bit string Hb'(p−1) generated by executing the carry-up process or the carry-down process as upper bits and the sampling data Sd(p) as lower bits (S270).

If it is determined that the change does not exceed the maximum Vmax (No in S250), the restoring part 220 generates a bit string having the upper bit string Hb(p−1) as upper bits and the sampling data Sd(p) as the lower bits (S270). The restoring part 220 stores the bit string generated in S270 in the count value table as a bit string indicating the count value Ct(p) (S280). The restoring part 220 determines whether all the compressed data (that is, all of the pieces of sampling data Sd(2) to Sd(n)) have been extracted from the data frame (S290), and finishes the process if it is determined that all the compressed data have been extracted (Yes in S290). If it is determined that all the compressed data have not been extracted (No in S290), the restoring part 220 extracts the next sampling data Sd(p+1) (S230), and executes the processes in and after S240.

As illustrated in (B) of FIG. 11, the PLC 20 restores the count values Ct(1) to Ct(n) from the pieces of sampling data Sd(1) to Sd(n), respectively, by executing the process illustrated in (A) of FIG. 11.

(Details of Restoration Process)

Figure 12:
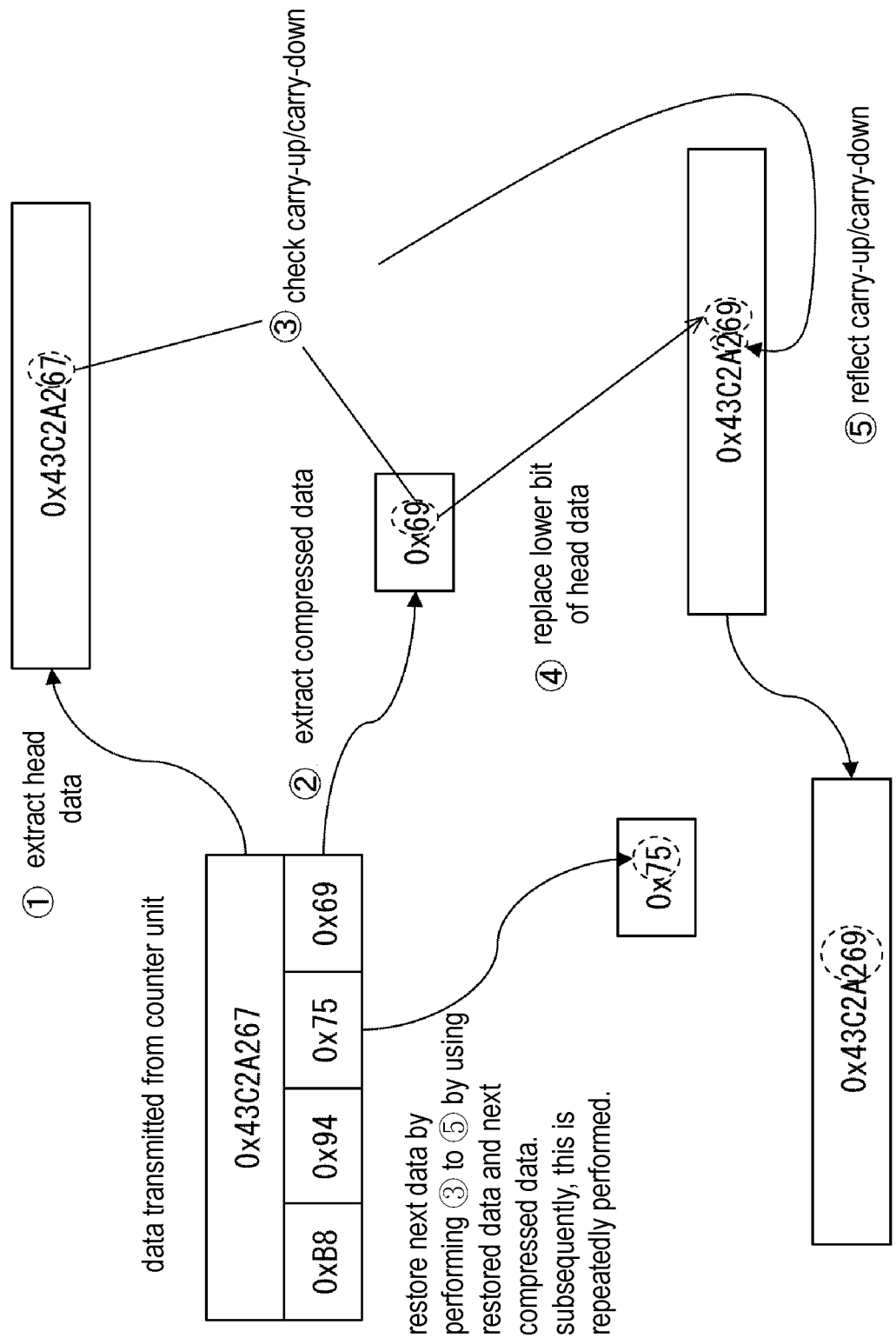
FIG. 12 is a diagram illustrating details of a data restoration process executed by the PLC in FIG. 1.

FIG. 12 is a diagram illustrating details of the data restoration process executed by the PLC 20 (in particular, the restoring part 220). The restoring part 220 restores the count value Ct(p) from the sampling data Sd(p) transmitted from the counter unit 10, and specifically, restores the respective pieces of sampling data Sd(2) to Sd(n) from the count values Ct(2) to Ct(n).

As illustrated in FIG. 12, first, the restoring part 220 extracts the head data (that is, the head sampling data Sd(1): 0x43C2A267) from the data (data frame) transmitted from the counter unit 10, and sets the head data as the count value Ct(1). Second, the restoring part 220 extracts the next compressed data, specifically, the sampling data Sd(2): 0x69. Third, the restoring part 220 executes the "carry-up/carry-down check" by using the lower bit string Lb: 0x67 of the count value Ct(1): 0x43C2A267 and the sampling data Sd(2): 0x69.

Fourth, if it is determined that there is no problem in the "carry-up/carry-down check", the restoring part 220 generates a bit string in which the lower bit string Lb: 0x67 of the count value Ct(1): 0x43C2A267 is replaced with the sampling data Sd(2): 0x69. That is, the restoring part 220 generates 0x43C2A269 as a bit string indicating the count value Ct(2) restored from the sampling data Sd(2).

If it is determined that there is a problem in the "carry-up/carry-down check", the restoring part 220 executes a carry-up process or a carry-down process on the upper bit string Hb(1): 0x43C2A2 of the count value Ct(1): 0x43C2A267 (fifth process).

The restoring part 220 executes the second to fifth processes by using the count value Ct(p) restored from the sampling data Sd(p) and the next compressed data (sampling data Sd(p+1)) to restore the count value Ct(p+1). The restoring part 220 executes the second to fifth processes on each of the pieces of sampling data Sd(2) to Sd(n) to restores each of the count values Ct(2) to Ct(n).

(Compressed Data Restoration Example 1: Compression Size is 1 Byte and Pulse Count Method is Bidirectional)

Figure 13:
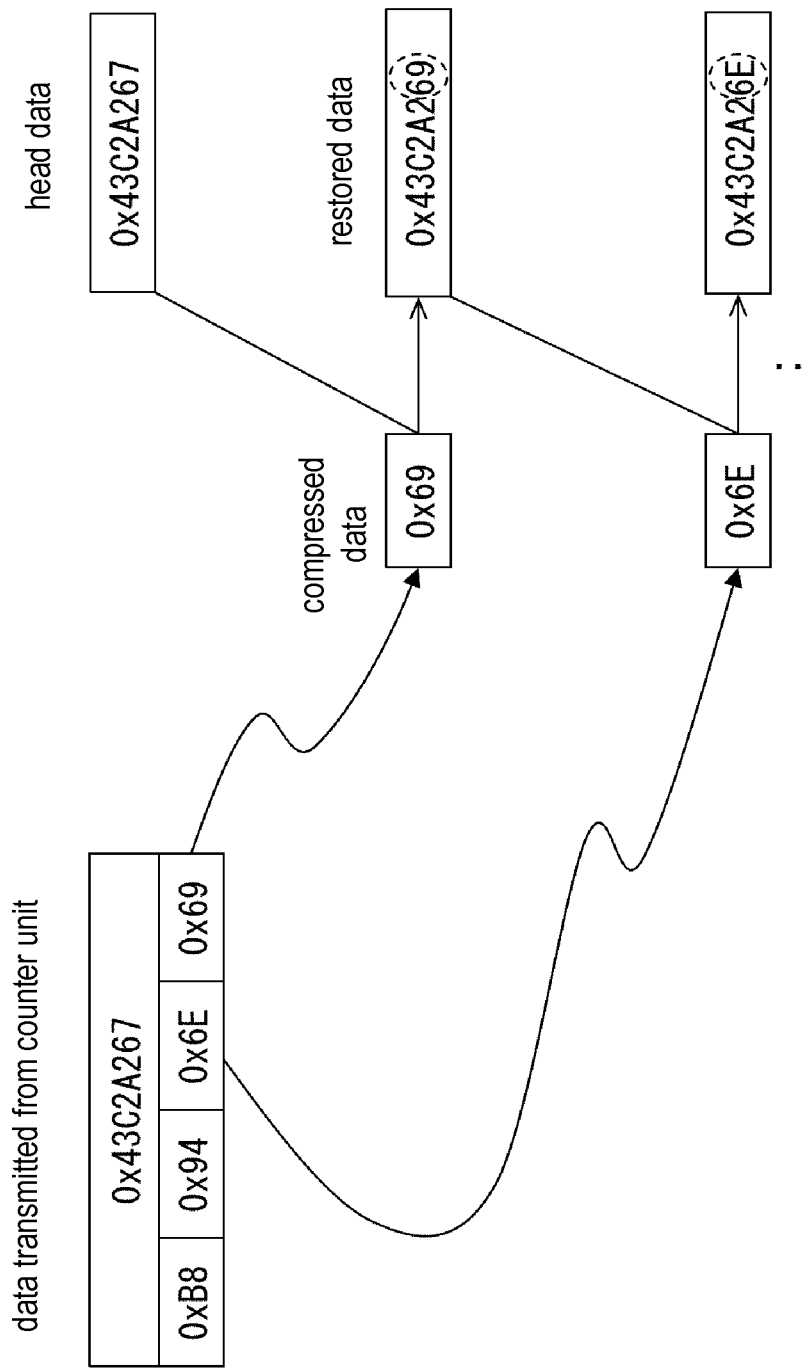
FIG. 13 is a diagram illustrating a data restoration process example in a case where a compression size is 1 byte and a pulse count method is bidirectional.

FIG. 13 is a diagram illustrating a data restoration process executed by the PLC 20 (in particular, the restoring part 220) in a case where the compression size is 1 byte and the pulse count method of the counter unit 10 is bidirectional. Since the compression size is 1 byte and the pulse count method is bidirectional, the maximum Vmax is "−127" or more and "127" or less, as described with reference to FIG. 8. First, the restoring part 220 extracts the head data (that is, the head sampling data Sd(1): 0x43C2A267) from the "data frame received by the data frame reception part 210" and stores the head data in the count value table as the count value Ct(1).

If the next compressed data (sampling data Sd(2): 0x69) is extracted from the data frame, the restoring part 220 compares the lower bit string Lb(1): 0x67 of the count value Ct(1) with the sampling data Sd(2): 0x69. The restoring part 220 determines that the change "2" from the lower bit string Lb(1): 0x67 of the count value Ct(1) to the sampling data Sd(2): 0x69 does not exceed the maximum Vmax (that is, "−127" or more and "127" or less).

Therefore, the restoring part 220 generates a bit string: 0x43C2A269 in which the lower bit string Lb(1): 0x67 of the count value Ct(1) is replaced with the sampling data Sd(2): 0x69. In other words, the restoring part 220 generates a bit string: 0x43C2A269 having the upper bit string Hb(1): 0x43C2A2 of the count value Ct(1) as upper bits and the sampling data Sd(2): 0x69 as lower bits. The restoring part 220 stores the generated bit string: 0x43C2A269 in the count value table as a bit string indicating the count value Ct(2) restored from the sampling data Sd(2).

Similarly, if the next compressed data (sampling data Sd(3): 0x6E) is extracted from the data frame, the restoring part 220 compares the lower bit string Lb(2): 0x69 of the count value Ct(2) with the sampling data Sd(3): 0x6E. The restoring part 220 determines that the change "5" from the lower bit string Lb(2): 0x69 of the count value Ct(2) to the sampling data Sd(3): 0x6E does not exceed the maximum Vmax (that is, "−127" or more and "127" or less).

Therefore, the restoring part 220 generates a bit string: 0x43C2A26E in which the lower bit string Lb(1): 0x69 of the count value Ct(2) is replaced with the sampling data Sd(3): 0x6E. In other words, the restoring part 220 generates a bit string: 0x43C2A26E having the upper bit string Hb(1): 0x43C2A2 of the count value Ct(2) as upper bits and the sampling data Sd(3): 0x6E as lower bits. The restoring part 220 stores the generated bit string: 0x43C2A26E in the count value table as a bit string indicating the count value Ct (3) restored from the sampling data Sd(3).

(In Case where there is Carry-Up/Carry-Down)

Figure 14:
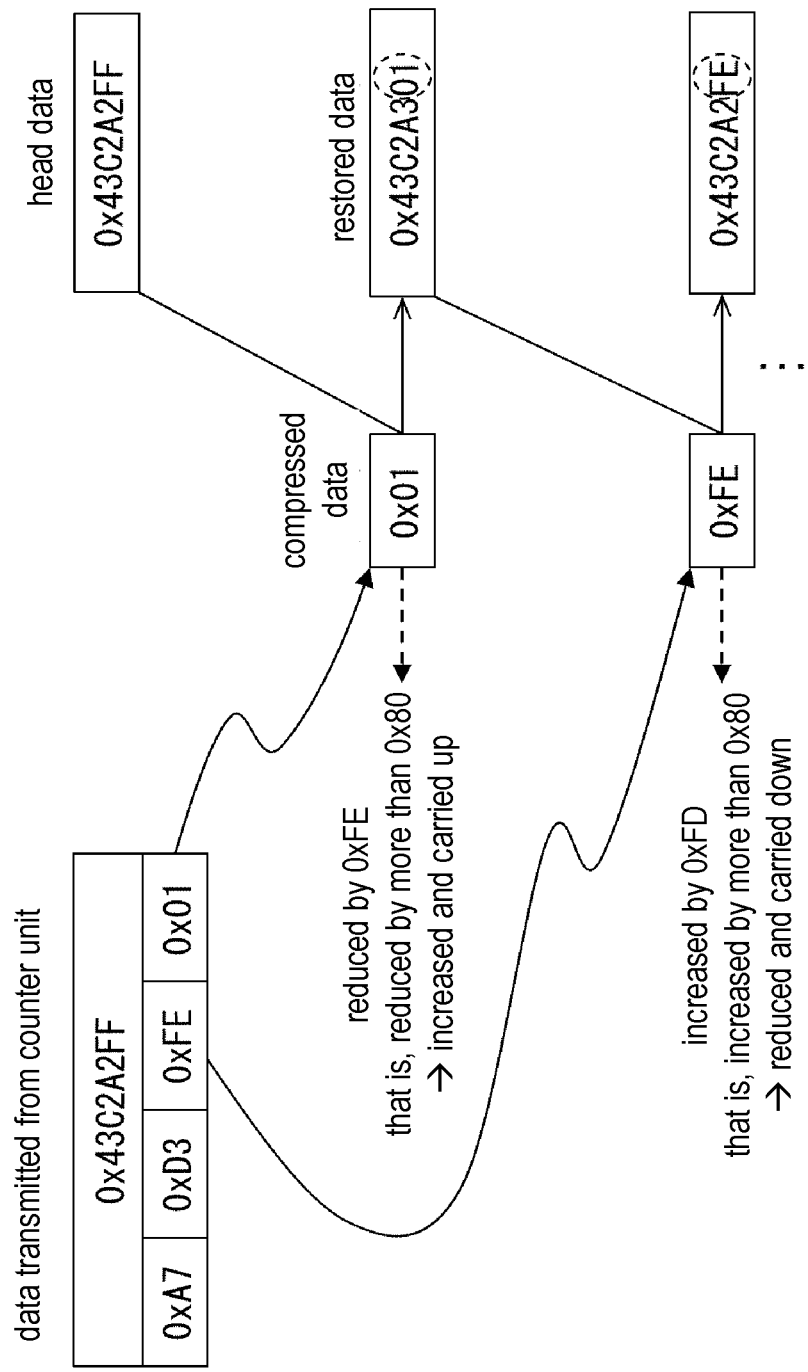
FIG. 14 is a diagram illustrating a specific example of a carry-up/carry-down process in the data restoration process example in a case where a compression size is 1 byte and a pulse count method is bidirectional.

FIG. 14 is a diagram illustrating a data restoration process executed by the PLC 20 in a case where the compression size is 1 byte and the pulse count method of the counter unit 10 is bidirectional in the same manner as in FIG. 13, and illustrates an example in which, in particular, the PLC 20 executes a carry-up/carry-down process. Since the compression size is 1 byte and the pulse count method is bidirectional, the maximum Vmax is "−127" or more and "127" or less as described above.

First, the restoring part 220 extracts the head data (that is, the head sampling data Sd(1): 0x43C2A2FF) from the "data frame received by the data frame reception part 210" and stores the head data in the count value table as the count value Ct(1).

If the next compressed data (sampling data Sd(2): 0x01) is extracted from the data frame, the restoring part 220 compares the lower bit string Lb(1): 0xFF of the count value Ct(1) with the sampling data Sd(2): 0x01. The restoring part 220 determines that the sampling data Sd(2): 0x01 is reduced by "0xFE", that is, is reduced by more than the maximum Vmax (that is, "−127" or more and "127" or less) from the lower bit string Lb(1): 0xFF. Therefore, the restoring part 220 determines that the sampling data Sd(2): 0x01 indicates not a value reduced from the lower bit string Lb(1): 0xFF but a value increased and carried up.

The restoring part 220 generates a bit string having a bit string: 0x43C2A3 obtained by adding 1 to the upper bit string Hb(1): 0x43C2A2 of the count value Ct(1) as upper bits and the sampling data Sd(2): 0x01 as lower bits. That is, the restoring part 220 generates a bit string: 0x43C2A301, and stores this bit string in the count value table as a bit string indicating the count value Ct(2) restored from the sampling data Sd(2).

Similarly, if the next compressed data (sampling data Sd(3): 0xFE) is extracted from the data frame, the restoring part 220 compares the lower bit string Lb(2): 0x01 of the count value Ct(2) with the sampling data Sd(3): 0xFE. The restoring part 220 determines that the sampling data Sd(3): 0xFE is increased by "0xFD", that is, by more than the maximum Vmax (that is, "−127" or more and "127" or less) from the lower bit string Lb(2): 0x01. Therefore, the restoring part 220 determines that the sampling data Sd(3): 0xFE indicates not a value increased from the lower bit string Lb(2): 0x01 but a value reduced and carried down.

The restoring part 220 generates a bit string having a bit string: 0x43C2A2 obtained by subtracting 1 from the upper bit string Hb(2): 0x43C2A3 of the count value Ct(2) as upper bits and the sampling data Sd(3): 0xFE as lower bits. That is, the restoring part 220 generates a bit string: 0x43C2A2FE, and stores this bit string in the count value table as a bit string indicating the count value Ct(3) restored from the sampling data Sd(3).

(Compressed Data Restoration Example 2: Compression Size is 2 Bits and Pulse Count Method is Bidirectional)

Figure 15:
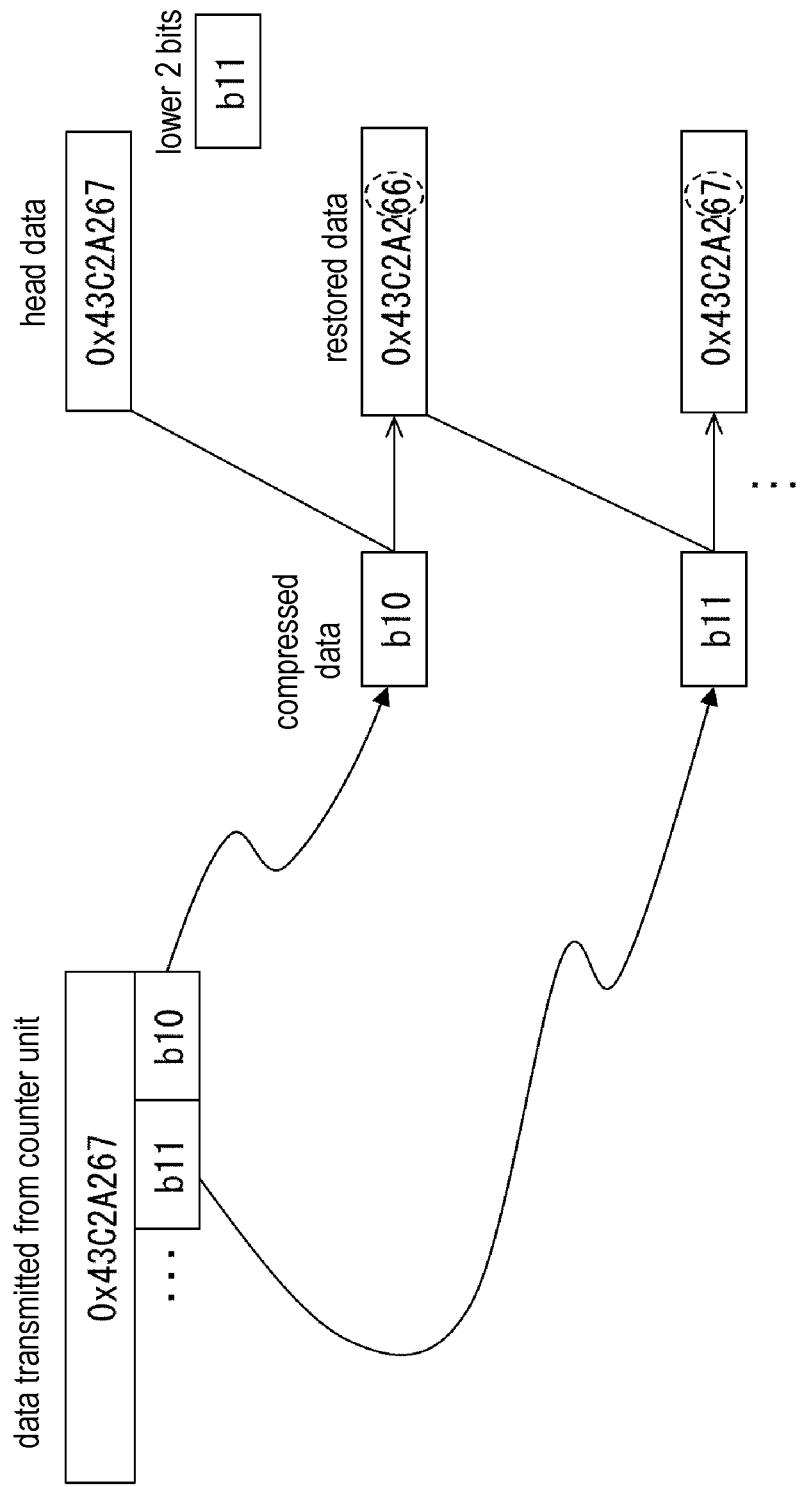
FIG. 15 is a diagram illustrating a data restoration process example in a case where a compression size is 2 bits and a pulse count method is bidirectional.

FIG. 15 is a diagram illustrating a data restoration process executed by the PLC 20 (in particular, the restoring part 220) in a case where the compression size is 2 bits and the pulse count method of the counter unit 10 is bidirectional. Since the compression size is 2 bits and the pulse count method is bidirectional, the maximum Vmax is "−1" or more and "1" or less as described with reference to FIG. 8. First, the restoring part 220 extracts the head data (that is, the head sampling data Sd(1): 0x43C2A267) from the "data frame received by the data frame reception part 210" and stores the head data in the count value table as the count value Ct(1). The lower bit string Lb(1) of the count value Ct(1): 0x43C2A267, which is a "bit string for the maximum Vmax (that is, 2 bits) including the least significant bit", is "b11".

If the next compressed data (sampling data Sd(2): b10) is extracted from the data frame, the restoring part 220 compares the lower bit string Lb(1): b11 of the count value Ct(1) with the sampling data Sd(2): b10. The restoring part 220 determines that the change "−1" from the lower bit string Lb(1): b11 of the count value Ct(1) to the sampling data Sd(2): b10 does not exceed the maximum Vmax (that is, "−1" or more and "1" or less).

Therefore, the restoring part 220 generates a bit string: 0x43C2A266 in which the lower bit string Lb(1): b11 of the count value Ct(1) is replaced with the sampling data Sd(2): b10. The restoring part 220 stores the generated bit string: 0x43C2A266 in the count value table as a bit string indicating the count value Ct(2) restored from the sampling data Sd(2).

Similarly, if the next compressed data (sampling data Sd(3): b11) is extracted from the data frame, the restoring part 220 compares the lower bit string Lb(2): b10 of the count value Ct(2) with the sampling data Sd(3): b 11. The restoring part 220 determines that the change "1" from the lower bit string Lb(2): b10 of the count value Ct(2) to the sampling data Sd(3): b11 does not exceed the maximum Vmax (that is, "−1" or more and "1" or less).

Therefore, the restoring part 220 generates a bit string: 0x43C2A267 in which the lower bit string Lb(1): b10 of the count value Ct(2) is replaced with the sampling data Sd(3): b11. The restoring part 220 stores the generated bit string: 0x43C2A267 in the count value table as a bit string indicating the count value Ct(3) restored from the sampling data Sd(3).

(In Case where there is Carry-Up/Carry-Down)

Figure 16:
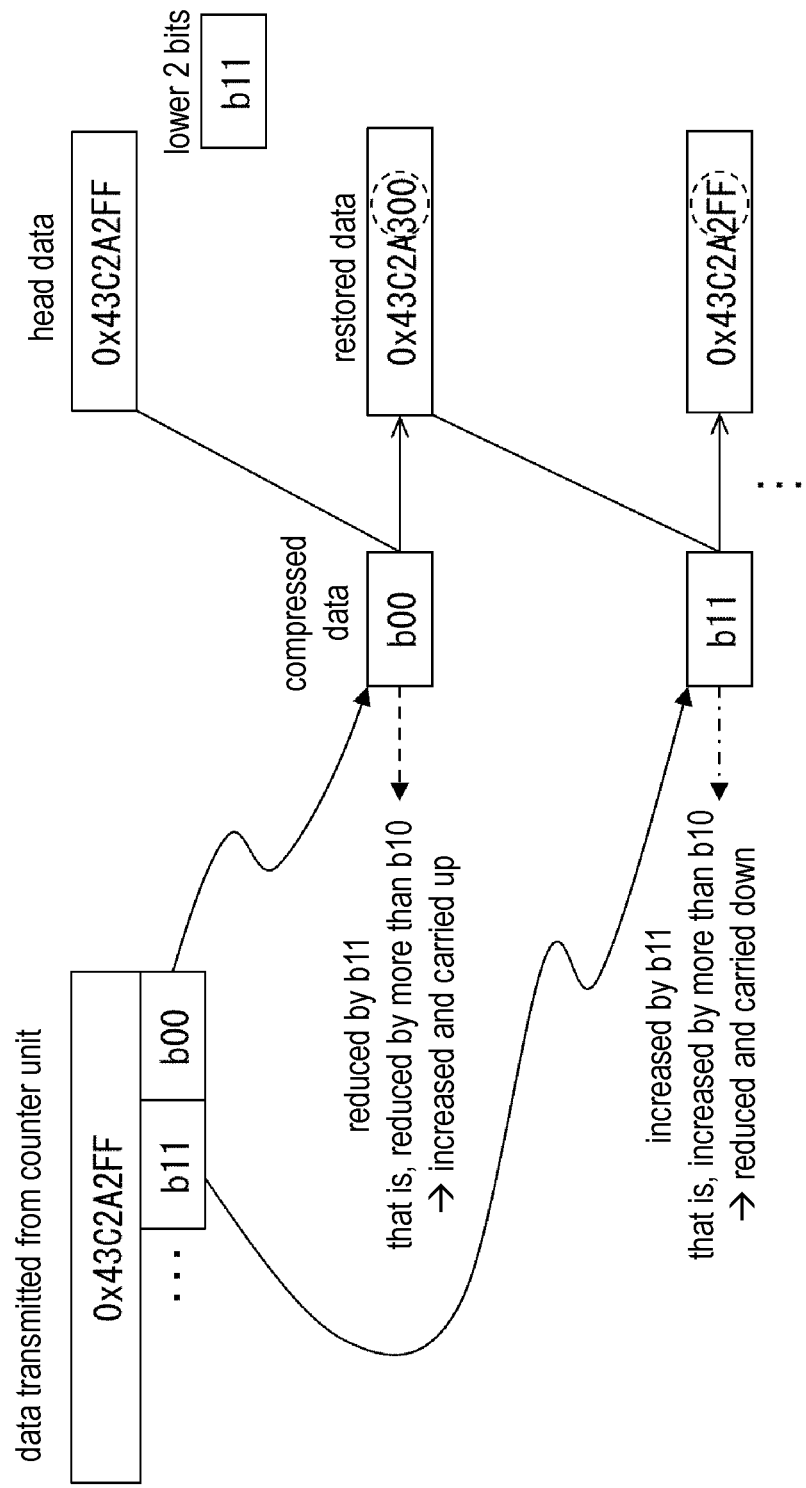
FIG. 16 is a diagram illustrating a specific example of a carry-up/carry-down process in the data restoration process example in a case where a compression size is 2 bits and a pulse count method is bidirectional.

FIG. 16 is a diagram illustrating a data restoration process executed by the PLC 20 in a case where the compression size is 2 bits and the pulse count method of the counter unit 10 is bidirectional in the same manner as in FIG. 15, and illustrates an example in which, in particular, the PLC 20 executes a carry-up/carry-down process. Since the compression size is 2 bits and the pulse count method is bidirectional, the maximum Vmax is "−1" or more and "1" or less as described above.

First, the restoring part 220 extracts the head data (that is, the head sampling data Sd(1): 0x43C2A2FF) from the "data frame received by the data frame reception part 210" and stores the head data in the count value table as the count value Ct(1). The lower bit string Lb(1) of the count value Ct(1): 0x43C2A2FF, which is the "bit string of the maximum Vmax (that is, 2 bits) including the least significant bit", is "b11".

If the next compressed data (sampling data Sd(2): b00) is extracted from the data frame, the restoring part 220 compares the lower bit string Lb(1): b11 of the count value Ct(1) with the sampling data Sd(2): b00. The restoring part 220 determines that the sampling data Sd(2): b00 is reduced by "b11", that is, by more than the maximum Vmax (that is, "−1" or more and "1" or less) from the lower bit string Lb(1): b11. Therefore, the restoring part 220 determines that the sampling data Sd(2): b00 indicates not a value reduced from the lower bit string Lb(1): b11 but a value increased and carried up.

The restoring part 220 generates a bit string: 0x43C2A300 having a bit string obtained by adding 1 to the upper bit string Hb(1) of the count value Ct(1) as upper bits and the sampling data Sd(2) as lower bits. The restoring part 220 stores the generated bit string: 0x43C2A300 in the count value table as a bit string indicating the count value Ct(2) restored from the sampling data Sd(2).

Similarly, if the next compressed data (sampling data Sd(3): b11) is extracted from the data frame, the restoring part 220 compares the lower bit string Lb(2): b00 of the count value Ct(2) with the sampling data Sd(3): b11. The restoring part 220 determines that the sampling data Sd(3): b11 is increased by "b11", that is, by more than the maximum Vmax (that is, "−1" or more and "1" or less) from the lower bit string Lb(2): b00. Therefore, the restoring part 220 determines that the sampling data Sd(3): b11 indicates not a value increased from the lower bit string Lb(2): b00 but a value reduced and carried down.

The restoring part 220 generates a bit string: 0x43C2A2FF having a bit string obtained by subtracting 1 from the upper bit string Hb(2) of the count value Ct(2) as upper bits and the sampling data Sd(3): b11 as lower bits. The restoring part 220 stores the generated bit string: 0x43C2A2FF in the count value table as a bit string indicating the count value Ct(3) restored from the sampling data Sd(3).

(Compressed Data Restoration Example 3: Compression Size is 1 Bit and Pulse Count Method is Unidirectional)

Figure 17:
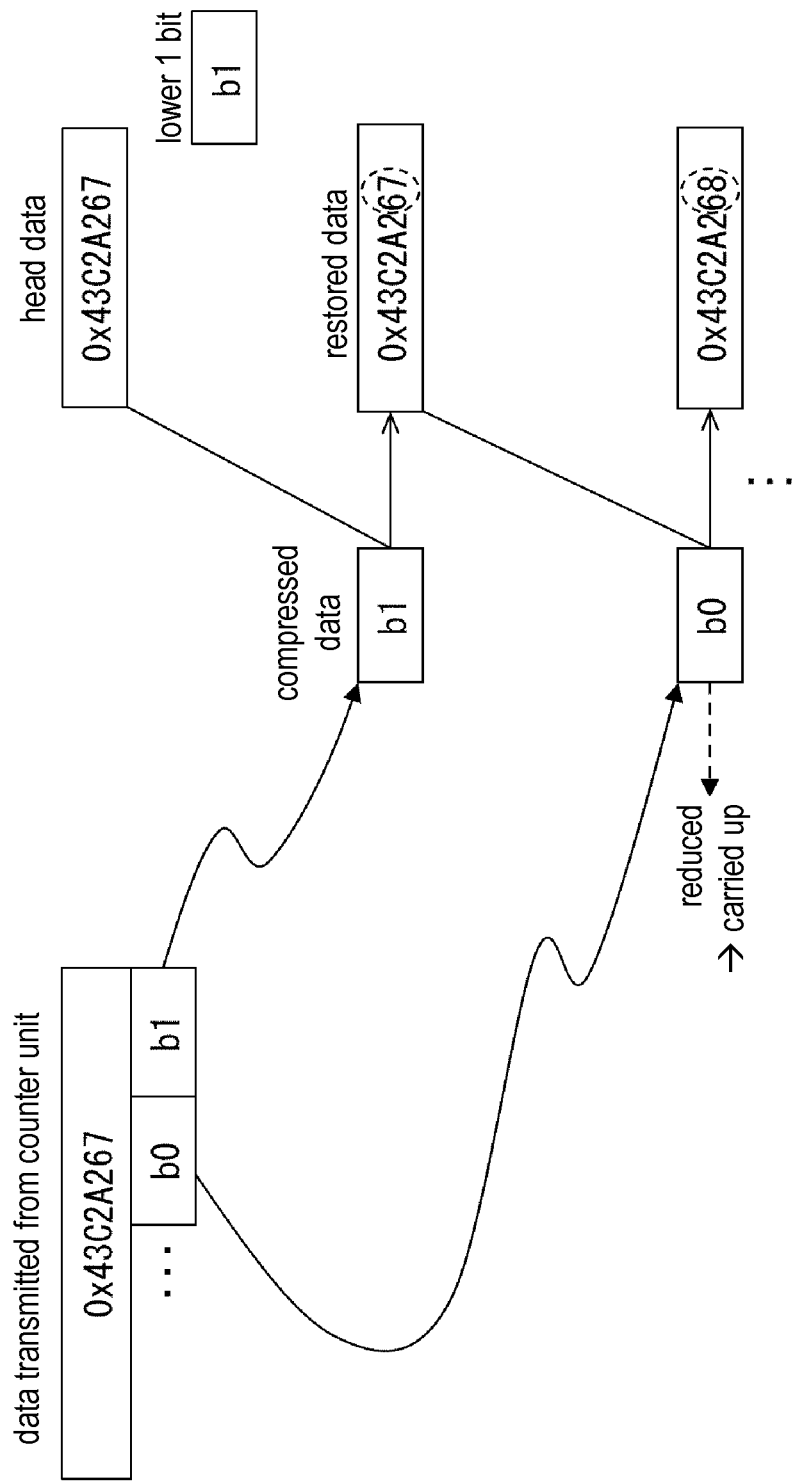
FIG. 17 is a diagram illustrating a data restoration process example in a case where a compression size is 1 bit and a pulse count method is unidirectional.

FIG. 17 is a diagram illustrating a data restoration process executed by the PLC 20 (in particular, the restoring part 220) in a case where the compression size is 1 bit and the pulse count method of the counter unit 10 is unidirectional. Since the compression size is 1 bit and the pulse count method is unidirectional, the maximum Vmax is "0" or more and "1" or less as described with reference to FIG. 8. First, the restoring part 220 extracts the head data (that is, the head sampling data Sd(1): 0x43C2A267) from the "data frame received by the data frame reception part 210" and stores the head data in the count value table as the count value Ct(1). The lower bit string Lb(1) of the count value Ct(1): 0x43C2A267, which is a "bit string of the maximum Vmax (that is, 1 bit) including the least significant bit", is "b1".

If the next compressed data (sampling data Sd(2): b1) is extracted from the data frame, the restoring part 220 compares the lower bit string Lb(1): b1 of the count value Ct(1) with the sampling data Sd(2): b1. The restoring part 220 determines that the change "0" from the lower bit string Lb(1): b1 of the count value Ct(1) to the sampling data Sd(2): b1 does not exceed the maximum Vmax (that is, "–1" or more and "1" or less).

Therefore, the restoring part 220 generates a bit string: 0x43C2A267 in which the lower bit string Lb(1): b1 of the count value Ct(1) is replaced with the sampling data Sd(2): b1. The restoring part 220 stores the generated bit string: 0x43C2A267 in the count value table as a bit string indicating the count value Ct(2) restored from the sampling data Sd(2).

Similarly, if the next compressed data (sampling data Sd(3): b0) is extracted from the data frame, the restoring part 220 compares the lower bit string Lb(2): b1 of the count value Ct(2) with the sampling data Sd(3): b0. The restoring part 220 determines that the sampling data Sd(3): b0 is reduced from the lower bit string Lb(2): b1, that is, reduced by more than the maximum Vmax (that is, "0" or more and "1" or less). Therefore, the restoring part 220 determines that the sampling data Sd(3): b0 indicates not a value reduced from the lower bit string Lb(2): b1 but a value increased and carried down.

The restoring part 220 generates a bit string: 0x43C2A268 having a bit string obtained by adding 1 to the upper bit string Hb(2) of the count value Ct(2) as upper bits and the sampling data Sd(3) as lower bits. The restoring part 220 stores the generated bit string: 0x43C2A268 in the count value table as a bit string indicating the count value Ct(3) restored from the sampling data Sd(3).

(Details of Tool)

As illustrated in FIG. 1, the tool 30 includes a calculation part 310 and a setting part 320 as functional blocks. In addition to the above-described functional blocks, the tool 30 may include a control period Sct adjustment part (not illustrated) that sets the control period Sct for the PLC 20. However, in order to simplify the description, a constituent not directly related to the present embodiment is omitted from the description and the block diagram. However, the tool 30 may have the omitted constituent according to an actual situation of implementation.

The setting part 320 sets a data size (number of bits) by which the maximum Vmax can be represented, that is, a compression size for at least one of the counter unit 10 and the PLC 20. According to the above configuration, the tool 30 sets the compression size for at least one of the counter unit 10 and the PLC 20.

Therefore, the tool 30 sets the compression size for the counter unit 10, and thus it is possible to achieve an effect that the counter unit 10 can transmit the sampling data Sd compressed to the compression size set by the tool 30 to the PLC 20. The tool 30 sets the compression size for the PLC 20 and thus it is possible to achieve an effect that the PLC 20 can restore the sampling data Sd compressed to the compression size.

The calculation part 310 calculates the compression size by using setting information for the counter unit 10 including information indicating the number of sampling processes executed by the counter unit 10 in one control period Sct. The setting part 320 sets the compression size calculated by the calculation part 310 for at least one of the counter unit 10 and the PLC 20.

According to the above configuration, the calculation part 310 of the tool 30 calculates the compression size by using the setting information for the counter unit 10, that is, calculates a data size (that is, the compression size) by which "the maximum Vmax of a change between two measurement results in sampling processes executed consecutively in one control period Sct" can be represented.

Here, the setting information may include, for example, the following information in addition to the "information indicating the number of sampling processes executed in one control period Set". That is, the setting information may include information indicating "the number of pulse signals receivable by the counter unit 10 in one sampling process".

As described above, "the number of pulse signals receivable by the counter unit 10 in one sampling process" may be calculated by at least one of a specification and an application of the encoder 40 (pulse signal generation device). Specifically, "the number of pulse signals receivable by the counter unit 10 in one sampling process" may be calculated based on "a resolution and the maximum rotation speed of the encoder 40" that are determined in advance by at least one of the specification and the application.

Therefore, the setting information may include information indicating "the resolution and the maximum rotation speed of the encoder 40" determined in advance by at least one of the specification and the application, instead of the information indicating the "number of receivable pulse signals".

The setting information may include a pulse count method type indicating whether the pulse count method of the counter unit 10 is unidirectional or bidirectional. The pulse count method type may indicate whether a pulse signal output by the encoder 40 that outputs the pulse signal to the counter unit 10 is a unidirectional pulse signal or a bidirectional pulse signal.

In a case where the pulse count method is bidirectional, a change between the measurement results in two of the sampling processes executed consecutively in one control period Set may be positive or negative. For example, in a case where "an absolute value of the number of pulses countable in one sampling process" is "127", the change between the measurement results in the two sampling processes executed consecutively in one control period Sct may be indicated as "−127 to 127". Therefore, the compression size is the number of bits obtained by adding 1 bit to the number of bits by which "an absolute value of the number of pulses countable in one sampling process" can be represented.

In a case where the pulse count method is unidirectional, the change between the measurement results in two sampling processes executed consecutively in one control period Sct is always positive or always negative. For example, in a case where "an absolute value of the number of pulses countable in one sampling process" is "255", the change between the measurement results in the two sampling processes executed consecutively in one control period Sct may be indicated as "0 to 255". Therefore, the compression size is the number of bits by which "the absolute value of the number of pulses countable in one sampling process" can be represented.

"The absolute value of the number of pulses countable in one sampling process" is a value obtained by rounding up digits after the decimal point of "a value obtained by dividing the sampling period Smc indicating a period per one sampling process by the shortest pulse period Plcmin of the pulse signal". The sampling period Smc may be calculated based on "the information indicating the number of sampling processes executed in one control period Sct" included in the setting information if the control period Sct is known. The "shortest pulse period Plcmin" may be calculated as a reciprocal of "a value obtained by dividing the maximum rotation speed by 60 and multiplying a division result by a resolution". As described above, the maximum rotation speed may be determined based on the specification (performance) of the encoder 40, and may also be determined based on the application (usage) thereof.

Therefore, it is possible to achieve an effect that the tool 30 can accurately calculate the compression size (that is, a size by which "the maximum Vmax of a change between the measurement results in two of the sampling processes executed consecutively in one control period Sct" can be represented) by using the setting information.

The tool 30 may include a tool storage part (not illustrated) as a storage device storing various data used by the tool 30. The tool storage part may non-temporarily store (1) a control program, (2) an OS program, (3) an application program for executing various functions of the tool 30, and (4) various data read when the application program is executed, which are executed by the tool 30. The data in the above (1) to (4) may be stored in a non-volatile storage device such as a read only memory (ROM), a flash memory, an erasable programmable ROM (EPROM), an Electrically EPROM (EEPROM) (registered trademark)), or a hard disk drive (HDD). The tool 30 may further include a tool temporary storage part. The tool temporary storage part is a so-called working memory that temporarily stores data used for calculation and calculation results in the process of various processes executed by the tool 30, and is configured with a volatile storage device such as a random access memory (RAM). Which data is stored in which storage device is determined as appropriate based on the purpose of use, convenience, cost, physical restrictions, and the like of the tool 30.

(Regarding Information Used by Tool)

FIG. 18 is a diagram illustrating an example of information (setting information) used when the tool 30 (in particular, the calculation part 310) calculates a compression size. The calculation part 310 acquires, for example, setting information as exemplified in FIG. 18 to calculate the number of bits by which a compression size, that is, the maximum Vmax (the count value Ct changeable in one sampling period Smc) can be represented. The tool 30 calculates the compression size by using, for example, the control period Sct, the number of sampling processes executed by the counter unit 10 in one control period Sct, the pulse count method of the counter unit 10, the resolution of the encoder 40, and the maximum rotation speed. As described above, the resolution and the maximum rotation speed of the encoder 40 are determined in advance by at least one of the specification (performance) and the application (usage) of the encoder 40. The tool 30 calculates the compression size by using the setting information indicating settings of the counter unit 10 and the like.

Even if the tool 30 may acquire the "sampling period Smc of the counter unit 10" instead of the information indicating the "control period Sct" and the "number of sampling processes executed by the counter unit 10 in one control period Sct". That is, the tool 30 may acquire the sampling period Smc of the counter unit 10 and the pulse count method as the setting information.

Instead of the information indicating the pulse count method of the counter unit 10, the tool 30 may acquire information indicating whether a pulse signal output by the encoder 40 is unidirectional or bidirectional as the setting information.

For example, if the control period Sct is "1 ms" and the number of sampling processes executed in one control period Sct is "10", the calculation part 310 calculates the sampling period Smc as "100 μs (=1 ms/10)".

If a resolution indicating the number of pulses output by the encoder 40 in a case where the shaft is rotated once is "360", and the maximum rotation speed indicating the number of rotations possible by the encoder 40 per minute is "6000 rpm", the calculation part 310 calculates the shortest pulse period Plcmin as follows. That is, the calculation part 310 calculates the shortest pulse period Plcmin as about "27.78 μs" from "1/{(6000/60)×360}".

The calculation part 310 calculates the absolute value of the number of pulses countable in one sampling process from the sampling period Smc (100 μs) and the shortest pulse period Plcmin (27.78 μs) as follows. That is, the calculation part 310 calculates the absolute value of the number of pulses countable in one sampling process as "4 (=ROUNDUP (100/27.78))". ROUNDUP (x) indicates a function that rounds up digits after the decimal point of the argument x.

Since the number of bits by which "4" can be represented is 3, in a case where the pulse count method of the counter unit 10 is bidirectional, the calculation part 310 determines the number of bits by which the maximum Vmax can be represented, that is, the compression size as "4 bits (=3 bits+1 bit)". The tool 30 sets the compression size (4 bits in the above example) calculated by using the setting information as described above for at least one of the counter unit 10 and the PLC 20.

The tool 30 may further calculate a data size of one data frame and set the calculated data size of one data frame for at least one of the counter unit 10 and the PLC 20. For example, assuming that the full size is 4 bytes, in the above example, the counter unit 10 executes ten sampling processes in one control period Set, and thus the data size of the data frame is about 9 bytes (=4 bytes+ROUNDUP ((9×4/8)). The data size (4 bytes in the above example) of one data frame calculated by the tool 30 may be set for at least one of the counter unit 10 and the PLC 20.

However, it is not essential that the tool 30 calculates a compression size and sets the calculated compression size for at least one of the counter unit 10 and the PLC 20. The counter unit 10 may calculate a compression size by using setting information related to settings of an own device or the like, and notify the PLC 20 of the calculated compression size. The PLC 20 may calculate a compression size by using setting information for the counter unit 10 or the like, and notify the counter unit 10 of the calculated compression size.

4. Modification Examples (Modification Example of Compression Method: Difference Data is Used as Sampling Data)

Figure 19:
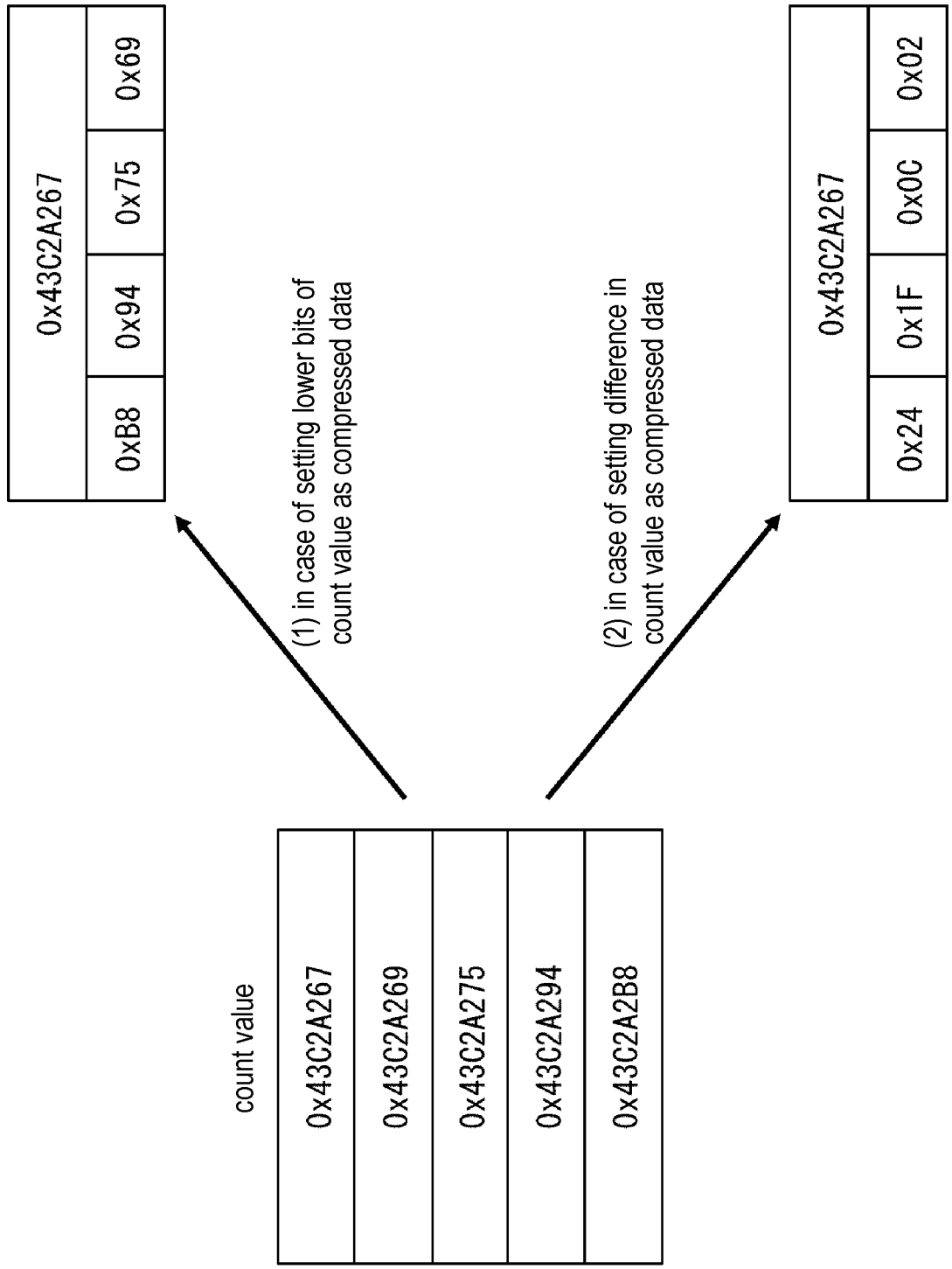
FIG. 19 is a diagram illustrating a comparison between a case where a lower bit string is extracted and a case where a difference is calculated in a data compression process executed by the control system in FIG. 2.

FIG. 19 is a diagram illustrating an example of a method of compressing a measurement result (for example, the count value Ct) measured in a sampling process to the sampling data Sd with a compression size. In particular, FIG. 19 illustrates a comparison between a case where the lower bit string Lb is extracted ((1) of FIG. 19) and a case where a difference is calculated ((2) of FIG. 19) for a data compression process.

The following example has been described hitherto as a method in which the compression part 130 compresses "a bit string indicating the count value Ct measured in each of the second and subsequent sampling processes" to the sampling data Sd with a compression size. That is, an example has been described in which the compression part 130 extracts "a bit string for the compression size including the least significant bit" from the bit string indicating the count value Ct as the lower bit string Lb, and stores the extracted lower bit string Lb as the sampling data Sd in a data frame. However, a method in which the compression part 130 compresses the "bit string indicating the count value Ct measured in each of the second and subsequent sampling processes" to the sampling data Sd with the compression size is not limited to the method of extracting the lower bit string Lb.

(1) of FIG. 19 illustrates a method in which the compression part 130 sets the lower bit string Lb(m) of the count value Ct(m) as the sampling data Sd(m) (compressed data) with the compression size (2 bytes). According to the method illustrated in (1) of FIG. 19, the sampling data Sd(1) is generated without being compressed from the count value Ct(1): 0x43C2A267. The lower bit string Lb(2): 0x69 with the compression size (2 bytes) is extracted from the count value Ct(2): 0x43C2A269 by the compression part 130, and the extracted lower bit string Lb(2): 0x69 is set as the sampling data Sd(2). The lower bit string Lb(3): 0x75 with the compression size (2 bytes) is extracted from the count value Ct(3): 0x43C2A275 by the compression part 130, and the extracted lower bit string Lb(3): 0x75 is set as the sampling data Sd(3). The lower bit string Lb(4): 0x94 with the compression size (2 bytes) is extracted from the count value Ct(4): 0x43C2A294 by the compression part 130, and the extracted lower bit string Lb(4): 0x94 is set as the sampling data Sd (4). The lower bit string Lb(5): 0xB8 with the compression size (2 bytes) is extracted from the count value Ct(5): 0x43C2A2B8 by the compression part 130, and the extracted lower bit string Lb(5): 0xB8 is set as the sampling data Sd (5).

(2) of FIG. 19 illustrates a method in which the compression part 130 sets a difference between the count value Ct(m) and the immediately preceding count value Ct(m−1) as the sampling data Sd(m) (compressed data) with the compression size. According to the method illustrated in (2) of FIG. 19, the sampling data Sd(1) is generated without being compressed from the count value Ct(1): 0x43C2A267. The compression part 130 calculates a bit string: 0x02 with the compression size (2 bytes), indicating an amount of change from the count value Ct(1): 0x43C2A267 based on the count value Ct(2): 0x43C2A269, and sets the bit string: 0x02 as the sampling data Sd(2). The compression part 130 calculates a bit string: 0x0C with the compression size (2 bytes), indicating an amount of change from the count value Ct(2): 0x43C2A269 based on the count value Ct(3): 0x43C2A275, and sets the bit string: 0x0C as the sampling data Sd(3). The compression part 130 calculates a bit string: 0x1F with the compression size (2 bytes), indicating an amount of change from the count value Ct(3): 0x43C2A275 based on the count value Ct(4): 0x43C2A294, and sets the bit string: 0x1F as the sampling data Sd(4). The compression part 130 calculates a bit string: 0x24 with the compression size (2 bytes), indicating an amount of change from the count value Ct(4): 0x43C2A294 based on the count value Ct(5): 0x43C2A2B8, and sets the bit string: 0x24 as the sampling data Sd(5).

As illustrated in (2) of FIG. 19, as a method of compressing the count value Ct(m) to the sampling data Sd(m) with the compression size, the compression part 130 may set a difference of the count value Ct(m) with the immediately preceding count value Ct(m−1) as the sampling data Sd(m). The compression part 130 calculates respective differences of the count values Ct(2) to Ct(n) with the Ct(1) to Ct(n−1).

That is, in the counter unit 10, the compression part 130 may set a bit string indicating an amount of change in a measurement result in each of the second and subsequent sampling processes from a measurement result in the immediately preceding sampling process as the sampling data Sd.

According to the above configuration, the counter unit 10 sets, as the sampling data Sd, a bit string indicating an amount of change in a measurement result in each of the second and subsequent sampling processes from a measurement result in the immediately preceding sampling process.

Here, as described above, a data size of the sampling data Sd is a data size by which the maximum Vmax of the change between the measurement results in the two sampling processes executed consecutively in one control period Set can be represented. Therefore, the data size of an amount of change in the measurement result in each of the second and subsequent sampling processes from the measurement result in the immediately preceding sampling process is equal to or less than the data size by which the maximum Vmax of the change can be represented, that is, equal to or less than the data size of the sampling data Sd.

Therefore, it is possible to achieve an effect that the counter unit 10 can transmit, to the PLC 20, a bit string indicating an amount of change in each of the measurement results in the second and subsequent sampling processes from the measurement result in the immediately preceding sampling process as the sampling data Sd.

In a case where the pieces of sampling data Sd(2) to Sd(n) are respective differences of the count values Ct(2) to Ct(n) with the count values Ct(1) to Ct(n−1), the PLC 20 restores the count values Ct(2) to Ct(n) as follows. That is, the restoring part 220 of the PLC 20 restores the count value Ct(m) by adding the sampling data Sd(m) to the immediately preceding count value Ct(m−1).

(Information Stored in Data Frame)

Figure 20:
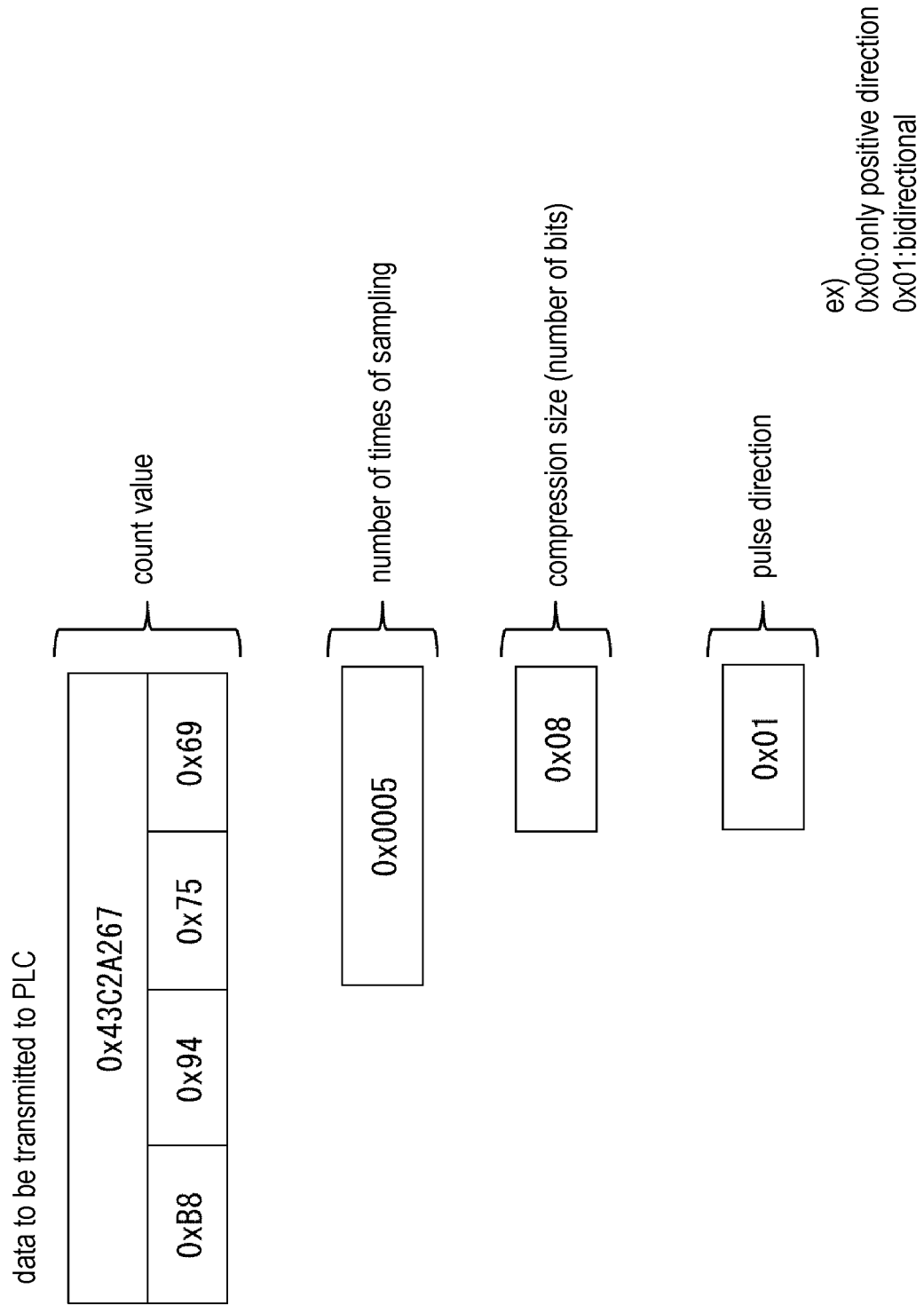
FIG. 20 is a diagram illustrating an example of information stored in a data frame transferred in every control period in the control system in FIG. 2.

FIG. 20 is a diagram illustrating an example of information stored in a data frame repeatedly transmitted by the counter unit 10 to the PLC 20 in every control period Sct. As illustrated in FIG. 20, the data frame transmitted by the counter unit 10 to the PLC 20 may store the following information in addition to the pieces of sampling data Sd(1) to Sd(n) respectively corresponding to the count values Ct(1) to Ct(n).

That is, the data frame may store information indicating the number of sampling processes (that is, the number of times of sampling) executed by the counter unit 10 in one control period Sct. For example, the data frame may store a bit string: 0x0005 indicating that the counter unit 10 executes five sampling processes in one control period Sct.

The data frame may store information indicating the compression size (number of bits), or may store, for example, a bit string: 0x08 indicating that the compression size is 8 bits (that is, 1 byte).

The data frame may store information indicating a pulse direction of a pulse signal output by the encoder 40, that is, information indicating the pulse count method of the counter unit 10. For example, the bit string: 0x00 may indicate that the pulse count method is unidirectional (only the positive direction), and the bit string: 0x01 may indicate that the pulse count method is bidirectional.

(Modification Examples of Sampling Process: Measuring Analog Value)

Figure 21:
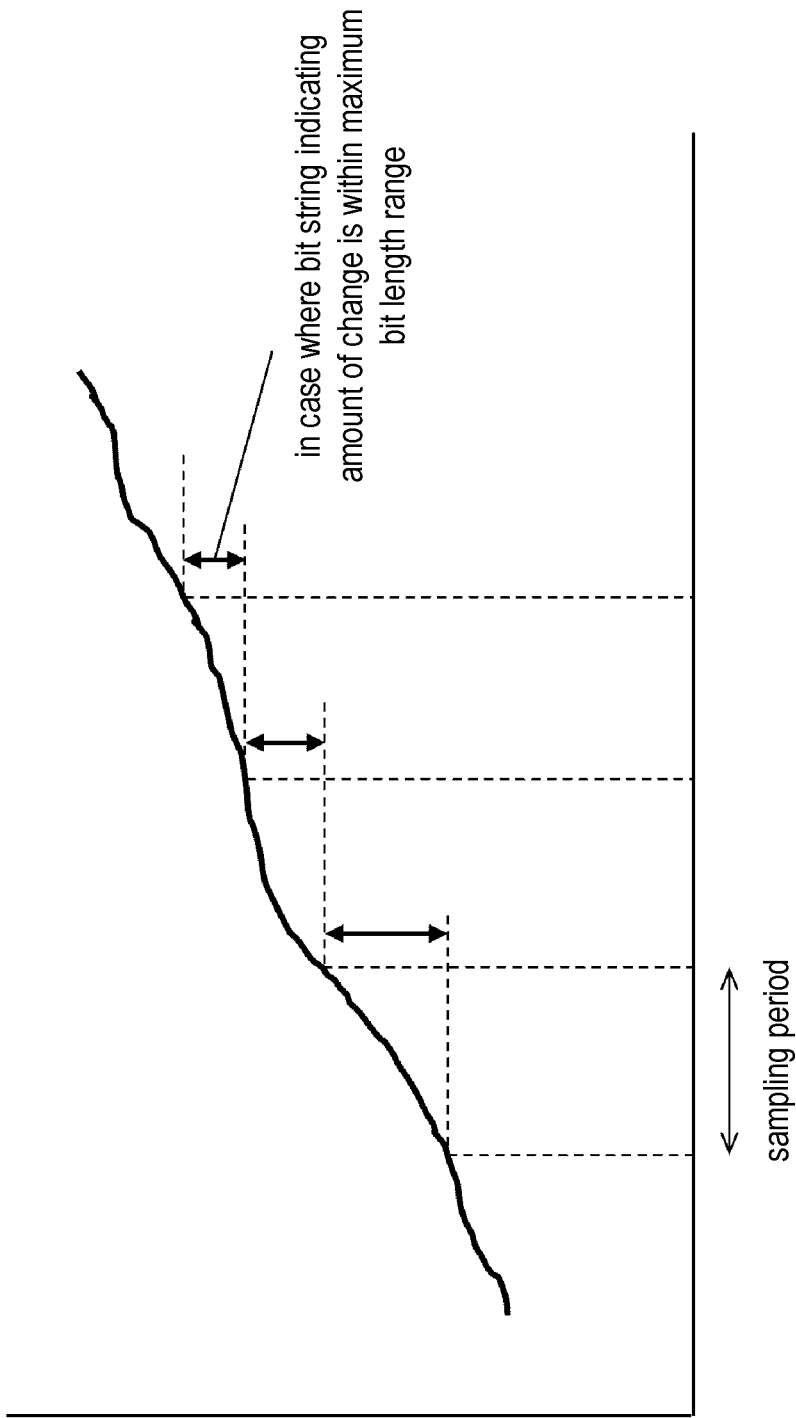
FIG. 21 is a diagram illustrating an outline of a process executed by an analog unit in FIG. 1.

FIG. 21 illustrates an example in which respective measurement results (analog values A1(1) to A1(n)) measured by the analog unit 60 in a plurality of sampling processes executed in one control period Sct are compressed to the sampling data Sd(1) to Sd(n) with the compression size. The analog unit 60 has the same configuration as that of the counter unit 10, and the measurement part 110 of the analog unit 60 executes a plurality of sampling processes in one control period Sct, and notifies the acquisition part 120 of the analog value A1 measured in each sampling process.

In the same manner as the compression part 130 of the counter unit 10, the compression part 130 of the analog unit 60 compresses the "analog value A1 measured in each of the second and subsequent sampling processes" to the number of bits by which the "analog value A1 changeable in one sampling period Smc" can be represented. The "analog value A1 changeable in one sampling period Smc" may be rephrased as an "amount of change in the analog value A1 changeable in one sampling period Smc". That is, the compression size is a data size by which the maximum Vmax of a change between two analog values A1 respectively counted in two sampling processes executed consecutively by the analog unit 60 in one control period Sct can be represented. In other words, the compression size is a data size by which the maximum Vmax of a change between the analog value A1(m) measured in the "m"-th sampling process and the analog value A1(m−1) measured in the "m−1"-th sampling process immediately before that can be represented.

In a case where a range of change in the analog value A1 changeable in one sampling period Smc is, for example, "−127" or more and "127" or less, 8 bits obtained by adding 1 bit to 7 bits by which "127" can be represented, that is, 1 byte is the compression size. Similarly, in a case where a range of change in the analog value A1 changeable in one sampling period Smc is, for example, "−1" or more and "1" or less, 2 bits obtained by adding 1 bit to 1 bit by which "1" can be represented is the compression size. In a case where a range of change in the analog value A1 changeable in one sampling period Smc is, for example, "0" or more and "255" or less, 8 bits by which "255" can be represented, that is, 1 byte is the compression size.

That is, the analog unit 60 (data transfer device) is a data transfer device that stores a plurality of pieces of sampling data Sd indicating respective measurement results (analog values A1) in a plurality of sampling processes executed in one control period Sct in one data frame and transmits the pieces of sampling data Sd to the PLC 20 in every control period Sct. The analog unit 60 includes the acquisition part 120 and the compression part 130. The acquisition part 120 acquires a measurement result (analog value A1) in each of a plurality of executed sampling processes. In a case where the maximum Vmax of a change between measurement results (analog values A1) in two sampling processes executed consecutively in one control period Sct is determined in advance, the compression part 130 compresses a measurement result (that is, each of the analog values A1(2) to A1(n)) in each of the second and subsequent sampling processes among the plurality of measurement results (analog values A1) acquired by the acquisition part 120 to the sampling data Sd with a data size (that is, the compression size) by which the maximum Vmax can be represented.

According to the above configuration, in a case where the maximum Vmax is determined in advance, the analog unit 60 compresses each of the pieces of sampling data Sd(2) to Sd(n) to a data size (that is, the compression size) by which the maximum Vmax can be represented, and transmits the sampling data Sd to the PLC 20.

Therefore, it is possible to achieve an effect that the analog unit 60 can suppress a data size of a data frame transmitted to the PLC 20 in every control period Set compared with a case where each of the analog values A1(2) to A1(n) is transmitted without being compressed.

In the same manner as the compression part 130 of the counter unit 10, the compression part 130 of the analog unit 60 may extract the respective lower bit strings Lb(2) to Lb(n) of the analog values A1(2) to A1(n) to generate the pieces of data Sd(2) to Sd(n). The compression part 130 of the analog unit 60 may set respective differences of the analog values A1(2) to A1(n) with the analog values A1(1) to A1(n−1) as the pieces of sampling data Sd(2) to Sd(n).

(Example of Connection Between Counter Unit and PLC)

The counter unit 10 and the PLC 20 may be communicatively connected to each other such that signals (data) can be transmitted and received to each other at regular communication periods, and a connection method between the counter unit 10 and the PLC 20 is not particularly limited. Similarly, the analog unit 60 and the PLC 20 may be communicatively connected to each other such that signals (data) can be transmitted and received to each other at regular communication periods, and a connection method between the analog unit 60 and the PLC 20 is not particularly limited.

Figure 22:
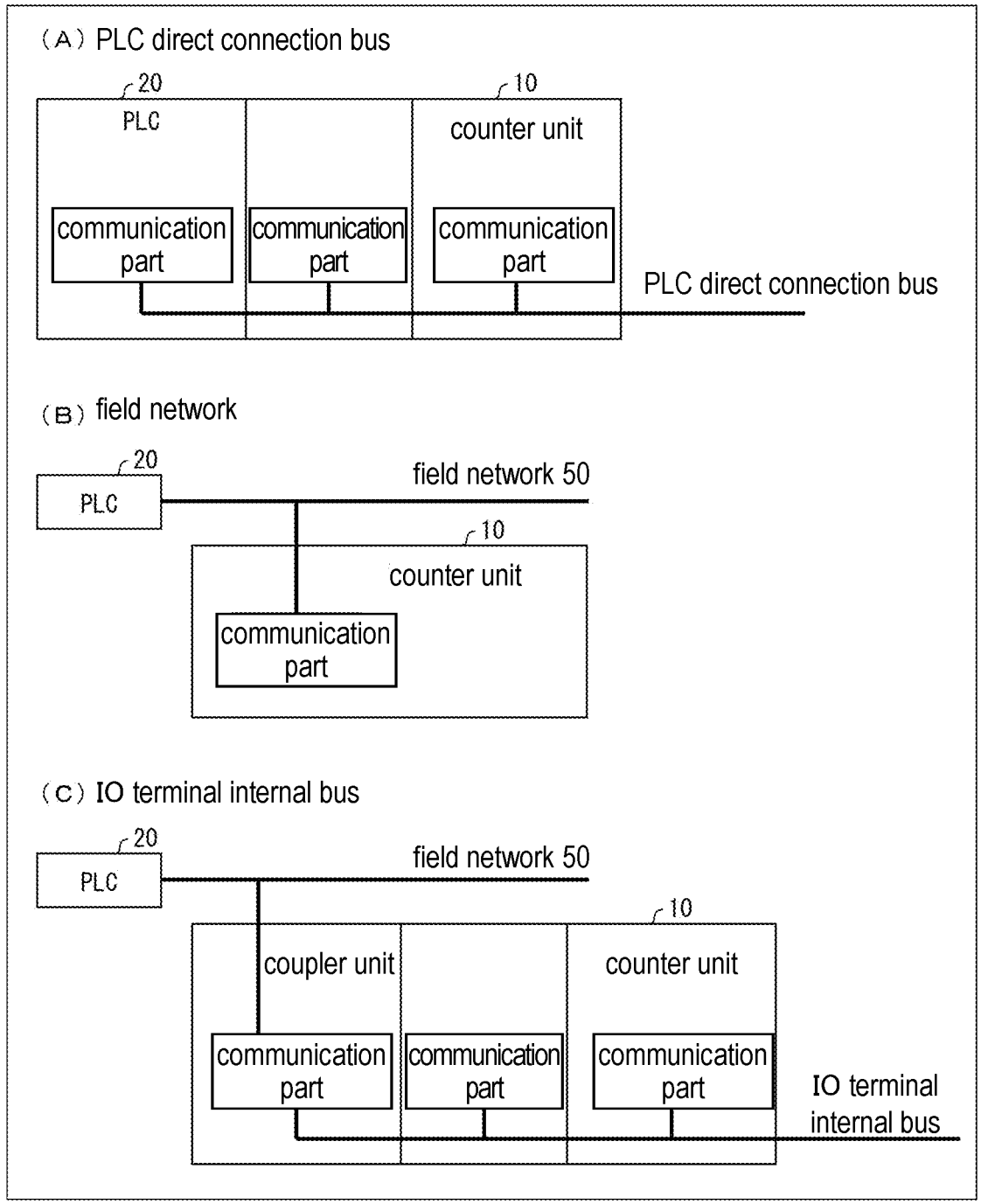
FIG. 22 is a diagram illustrating an example of connection between the counter unit in FIG. 1 and the PLC in FIG. 1.

FIG. 22 is a diagram illustrating an example of connection between the counter unit 10 and the PLC 20. The counter unit 10 and the PLC 20 are communicatively connected to each other, and in particular, the counter unit 10 and the PLC 20 repeatedly transmit and receive data to and from each other at a predetermined communication period (for example, the control period Set of the PLC 20). The counter unit 10 may be able to communicate with the PLC 20 periodically, and a bus/network configuration between the counter unit 10 and the PLC 20 is not particularly limited.

That is, as illustrated in (A) of FIG. 22, the counter unit 10 and the PLC 20 may be communicatively connected to each other via a PLC direct connection bus. That is, the counter unit 10 may be integrally configured with the PLC 20 (in other words, as a functional unit of the PLC 20), and the counter unit 10 and the PLC 20 (in particular, the CPU unit of the PLC 20) may be connected via an internal bus.

As illustrated in (B) of FIG. 22, the counter unit 10 and the PLC 20 may be communicatively connected to each other via the field network 50. As the field network 50 connecting the counter unit 10 to the PLC 20, various types of Industrial Ethernet (registered trademark) may be typically used. As industrial Ethernet (registered trademark), for example, EtherCAT (registered trademark), Profile IRT, MECHATROLINK (registered trademark)-III, Powerlink, SERCOS (registered trademark)-III, and CIP Motion are known, and any of these may be used. A field network other than industrial Ethernet (registered trademark) may be used. For example, if motion control is not performed, DeviceNet, CompoNet/IP (registered trademark), or the like may be used. In the example illustrated in (B) of FIG. 22, in a master-slave control system using the PLC 20 as a master device, the counter unit 10 as a slave device is connected to the PLC 20 via the field network 50.

As illustrated in (C) of FIG. 22, the counter unit 10 and the PLC 20 may be communicatively connected to each other via an IO terminal internal bus. More specifically, the counter unit 10 and a coupler unit (communication coupler) may be communicatively connected to each other via the IO terminal internal bus (internal bus) to integrally configure an IO unit. In a master-slave control system using the PLC 20 as a master device, the IO unit including the counter unit 10 and the coupler unit may be connected to the PLC 20 via the field network 50 as a slave device.

[Example of Realization by Software]

Each functional block (specifically, the measurement part 110, the acquisition part 120, the compression part 130, the transmission part 140, the data frame reception part 210, the restoring part 220, the calculation part 310, and the setting part 320) of the counter unit 10, the PLC 20, and the tool 30 may be realized by a logic circuit (hardware) formed in an integrated circuit (IC chip) or the like, or may be realized by software by using a central processing unit (CPU).

In the latter case, each of the counter unit 10, the PLC 20, and the tool 30 includes, for example, a CPU that executes commands of a program that is software realizing each function, a read only memory (ROM) or a storage device (these are referred to as "recording media") on which the above program and various data are recorded to be readable by a computer (or the CPU), and a random access memory (RAM) to which the program is loaded. The object of the present invention is achieved by the computer (or the CPU) reading the program from the recording medium and executing the program. As the recording medium, a "non-transitory medium", for example, a tape, a disk, a card, a semiconductor memory, or a programmable logic circuit may be used. The program may be supplied to the computer via any transmission medium (a communication network, a broadcast wave, or the like) capable of transmitting the program. The present invention can also be realized in the form of a data signal embedded in a carrier wave, in which the above program is embodied by electronic transmission.

APPENDIX

A data transfer device according to one aspect of the present invention is a data transfer device that stores a plurality of pieces of sampling data indicating respective measurement results in a plurality of sampling processes executed in one control period in one data frame and transmits the sampling data to a control device at each of the control period, and includes an acquisition part that acquires the measurement results in the respective executed sampling processes, and a compression part that, in a case where a maximum of a change between the measurement results in two of the sampling processes executed consecutively at the one control period is determined in advance, compresses the measurement result in each of second and subsequent sampling processes among the plurality of the measurement results acquired by the acquisition part to the sampling data with a data size by which the maximum is able to be represented.

According to the above configuration, in a case where the maximum is determined in advance, the data transfer device compresses the sampling data indicating the measurement result in each of the second and subsequent sampling processes to a data size by which the maximum is able to be represented and transmits the sampling data to the control device.

Therefore, it is possible to achieve an effect that the data transfer device can suppress the data size of the data frame transmitted to the control device in every control period compared with a case where each of the measurement results in the second and subsequent sampling processes is not compressed.

Here, in a case where the change may be either positive or negative, for example, in a case where a range of the change is "−127" or more and "127" or less, 8 bits obtained by adding 1 bit to 7 bits by which "127" can be represented, that is, 1 byte is a data size by which the maximum is able to be represented. Similarly, for example, in a case where a range of the change is "−1" or more and "1" or less, 2 bits obtained by adding 1 bit to 1 bit by which "1" can be represented is a data size by which the maximum is able to be represented.

In a case where the change is always positive or always negative, for example, in a case where a range of the change is "0" or more and "255" or less, 8 bits by which "255" can be represented, that is, 1 byte is a data size by which the maximum is able to be represented. Similarly, for example, in a case where the range of the change is "0" or more and "1" or less, 1 bit by which "1" can be represented is a data size by which the maximum is able to be represented.

In the data transfer device according to one aspect of the present invention, the sampling process may be a process of counting the number of pulses of a pulse signal, and the measurement result may be the counted number of pulses.

According to the above configuration, in a case where the maximum is determined in advance, the data transfer device compresses the sampling data indicating the measured number of pulses in each of the second and subsequent sampling processes to a data size by which the maximum is able to be represented.

Here, in the sampling process of counting the number of pulses of a pulse signal, the number of pulses that can be measured in one sampling process is determined in advance, that is, in a case where the sampling process is a process of counting the number of pulses, the maximum is determined in advance.

More specifically, the number of pulse signals receivable by the data transfer device from "a pulse signal generation device such as an encoder or a flow meter that generates a pulse signal according to a detection amount" in one sampling process is determined in advance. For example, in a case where pulse signals from the encoder are counted, the number of pulse signals receivable by the data transfer device per unit time is determined in advance based on a resolution and a rotation speed (maximum rotation speed) of the encoder. The maximum rotation speed may be determined based on a specification (performance) of the encoder, and may also be determined based on an application (usage of the encoder). For example, if the application is "a low-speed application in which the encoder rotates at a maximum of 60 rpm (one rotation per second) at the resolution of 360", even if the encoder can rotate at a higher speed in terms of specification, the maximum rotation speed may be assumed to be 60 rpm. That is, the number of pulse signals receivable by the data transfer device in one sampling process is determined in advance based on at least one of the specification and the application of the encoder (pulse signal generation device).

Therefore, it is possible to achieve an effect that the data transfer device can compress the sampling data indicating the number of pulses measured in each of the second and subsequent sampling processes to a data size by which the maximum is able to be represented and transmit the sampling data to the control device.

In the data transfer device according to one aspect of the present invention, the data size by which the maximum is able to be represented may be determined in advance based on (1) an absolute value of the number of pulses countable in one sampling process, and (2) whether a pulse count method in the sampling process is bidirectional or unidirectional.

According to the above configuration, in the data transfer device, the data size by which the maximum is able to be represented is determined in advance based on (1) an absolute value of the number of pulses countable in one sampling process, and (2) a pulse count method.

In a case where the pulse count method is bidirectional, the change between the measurement results in the two sampling processes executed consecutively at the one control period may be positive or negative. For example, in a case where "the absolute value of the number of pulses countable in one sampling process" is "127", the change between the measurement results in the two sampling processes executed consecutively at the one control period may be indicated as "−127 to 127". Therefore, the data size by which the maximum is able to be represented is the number of bits obtained by adding 1 bit to the number of bits by which "the absolute value of the number of pulses countable in one sampling process" can be represented.

In a case where the pulse count method is unidirectional, the change between the measurement results in the two sampling processes executed consecutively at the one control period is always positive or always negative. For example, in a case where "the absolute value of the number of pulses countable in one sampling process" is "255", the change between the measurement results in the two sampling processes executed consecutively at the one control period may be indicated as "0 to 255". Therefore, a data size by which the maximum is able to be represented is the number of bits by which "the absolute value of the number of pulses countable in one sampling process" can be represented.

Therefore, the maximum is determined in advance, and thus it is possible to achieve an effect that the data transfer device can compress the sampling data indicating the number of pulses measured in each of the second and subsequent sampling processes to the data size by which the maximum is able to be represented.

In the data transfer device according to one aspect of the present invention, the compression part may extract a bit string for the number of bits by which the maximum is able to be represented, including the least significant bit, from a bit string indicating the measurement result in each of the second and subsequent sampling processes, and set the extracted bit string as the sampling data.

According to the above configuration, the data transfer device sets, as the sampling data, a bit string for the number of bits by which the maximum is able to be represented, including the least significant bit, and extracted from a bit string indicating a measurement result in each of the second and subsequent sampling processes.

It is obvious that compared with a data size of a bit string indicating a measurement result in each of the second and subsequent sampling processes, a data size of "a bit string for the number of bits by which the maximum is able to be represented, including the least significant bit", and extracted from the bit string is small.

Therefore, it is possible to achieve an effect that the data transfer device can compress a bit string indicating a measurement result in each of the second and subsequent sampling processes to "a bit string for the number of bits by which the maximum is able to be represented, including the least significant bit", and extracted from the bit string.

For example, in a case where a bit string indicating each measurement result in the sampling process has a size of 4 bytes, and thus a range of the change is "−127" or more and "127" or less, the data size by which the maximum is able to be represented is 1 byte, and the data transfer device performs the following compression. That is, the data transfer device compresses a 4-byte bit string indicating the measurement result in each of the second and subsequent sampling processes to 1-byte sampling data.

Similarly, in a case where a range of the change is "−1" or more and "1" or less, a data size by which the maximum is able to be represented is 2 bits, and thus the data transfer device compresses a 4-byte bit string indicating the measurement result in each of the second and subsequent sampling processes to 2-bit bit string. In a case where a range of the change is "0" or more and "1" or less, a data size by which the maximum is able to be represented is 1 bit, and thus the counter unit 10 compresses a 4-byte bit string indicating each of the measurement results in the second and subsequent sampling processes to 1-bit sampling data.

In the data transfer device according to one aspect of the present invention, the compression part may set a bit string indicating an amount of change in the measurement result in each of the second and subsequent sampling processes from a measurement result in an immediately preceding sampling process as the sampling data.

According to the above configuration, the data transfer device sets a bit string indicating an amount of change in a measurement result in each of the second and subsequent sampling processes from a measurement result in the immediately preceding sampling process as the sampling data.

Here, as described above, the data size of the sampling data is a data size by which the maximum of the change between the measurement results in the two sampling processes executed consecutively at the one control period can be represented. Therefore, the data size of an amount of change in the measurement result in each of the second and subsequent sampling processes from the measurement result in the immediately preceding sampling process is equal to or less than the data size by which the maximum of the change can be represented, that is, equal to or less than the data size of the sampling data.

Therefore, it is possible to achieve an effect that the data transfer device can transmit, to the control device, a bit string indicating change in each of the measurement results in the second and subsequent sampling processes from the measurement result in the immediately preceding sampling process as the sampling data.

A control device according to one aspect of the present invention may include a data frame reception part that receives the data frame from the data transfer device according to the aspect of the present invention at each of the control period, and a restoring part that restores the measurement result in each of the second and subsequent sampling processes from the sampling data compressed to the data size by which the maximum is able to be represented in the data frame received by the data frame reception part.

According to the above configuration, the control device restores the measurement result in each of the second and subsequent sampling processes from the sampling data compressed to the data size by which the maximum is able to be represented.

Therefore, it is possible to achieve an effect that the control device can acquire the measurement result in each of the second and subsequent sampling processes from the sampling data of which the data size is suppressed compared with a case where the data size is not compressed, in the same manner as in a case where the data size is not compressed.

In the control device according to one aspect of the present invention, the restoring part may restore the respective measurement results in the second and subsequent sampling processes such that an amount of change from the measurement result in the immediately preceding sampling process is equal to or less than the maximum by using a bit string indicating the measurement result in the immediately preceding sampling process and a bit string stored in the data frame as the sampling data indicating each of the measurement results in the second and subsequent sampling processes.

According to the above configuration, the control device restores the respective measurement results in the second and subsequent sampling processes according to the following method. That is, the control device restores the respective measurement results in the second and subsequent sampling processes by using a bit string indicating the measurement result in the immediately preceding sampling process and a bit string stored in the data frame as the sampling data. In this case, the control device restores "each of the measurement results in the second and subsequent sampling processes" such that an amount of change in "each of the measurement results in the second and subsequent sampling processes" from the measurement result in the immediately preceding sampling process is equal to or less than the maximum.

Therefore, it is possible to achieve an effect that the control device can accurately restore the respective measurement results in the second and subsequent sampling processes by using the bit string stored in the data frame as the sampling data.

For example, first, the control device acquires the sampling data that is a restoration target and a bit string indicating a measurement result measured in a sampling process executed immediately before a sampling process in which a measurement result obtained by restoring the sampling data is measured.

Next, the control device extracts "a bit string for the number of bits by which the maximum is able to be represented, including the least significant bit" from the bit string indicating the measurement result in the immediately preceding sampling process, and compares with the extracted bit string with the sampling data that is a restoration target. Here, "the bit string for the number of bits by which the maximum is able to be represented, including the least significant bit" is referred to as a "lower bit string". A bit string other than the "bit string for the number of bits by which the maximum is able to be represented, including the least significant bit" in the bit string indicating the measurement result in the immediately preceding sampling process will be referred to as an "upper bit string" of the bit string indicating the measurement result in the immediately preceding sampling process. That is, the "upper bit string of the bit string indicating the measurement result in the immediately preceding sampling process" is a bit string other than the lower bit string of the bit string indicating the measurement result in the immediately preceding sampling process.

If it is determined that an amount of change in the sampling data that is a restoration target from the "lower bit string of the bit string indicating the measurement result in the immediately preceding sampling process" is equal to or less than the maximum, the control device executes the following process.

That is, the control device generates a bit string in which the "upper bit string of the bit string indicating the measurement result in the immediately preceding sampling process" and the "sampling data that is a restoration target" are combined as a bit string indicating a measurement result restored from the "sampling data that is a restoration target". Specifically, the control device generates a bit string having "the upper bit string of the bit string indicating the measurement result in the immediately preceding sampling process" as upper bits and "the sampling data that is a restoration target" as lower bits, as the bit string indicating the restored measurement result.

If it is determined that the sampling data that is a restoration target is reduced by more than the maximum from "the lower bit string of the bit string indicating the measurement result in the immediately preceding sampling process", the control device executes the following process.

That is, first, the control device determines that the sampling data that is a restoration target indicates not a value reduced from "the lower bit string of the bit string indicating the measurement result in the immediately preceding sampling process" but a value increased and carried up. The control device generates the bit string indicating the measurement result restored from the "sampling data that is a restoration target" by using a bit string obtained by adding 1 to "the upper bit string of the bit string indicating the measurement result in the immediately preceding sampling process". Specifically, the control device generates a bit string having the bit string obtained by adding 1 to "the upper bit string of the bit string indicating the measurement result in the immediately preceding sampling process" as the upper bit and the "sampling data that is a restoration target" as lower bits.

If it is determined that the sampling data that is a restoration target is increased by more than the maximum from "the lower bit string of the bit string indicating the measurement result in the immediately preceding sampling process", the control device executes the following process.

That is, first, the control device determines that the sampling data that is a restoration target indicates not a value increased from "the lower bit string of the bit string indicating the measurement result in the immediately preceding sampling process" but a value decreased and carried down. The control device generates a bit string indicating the measurement result restored from the "sampling data that is a restoration target" by using a bit string obtained by subtracting 1 from "the upper bit string of the bit string indicating the measurement result in the immediately preceding sampling process". Specifically, the control device generates a bit string having the bit string obtained by subtracting 1 from "the upper bit string of the bit string indicating the measurement result in the immediately preceding sampling process" as the upper bit and the "sampling data that is a restoration target" as lower bits.

A setting device according to one aspect of the present invention may include a setting part that sets the data size by which the maximum is able to be represented for at least one of the data transfer device according to the aspect of the present invention and the control device according to the aspect of the present invention.

According to the above configuration, the setting device sets the data size by which the maximum is able to be represented for at least one of the data transfer device and the control device. Therefore, it is possible to achieve an effect that the setting device can transmit the sampling data compressed by the data transfer device to the "data size by which the maximum is able to be represented" set by the setting device to the control device. Alternatively, it is possible to achieve an effect that the setting device can restore the sampling data compressed by the control device to the "data size by which the maximum is able to be represented" set by the setting device.

The setting device according to one aspect of the present invention may further include a calculation part that calculates the data size by which the maximum is able to be represented by using setting information for the data transfer device, which includes information indicating the number of sampling processes executed by the data transfer device at the one control period, and the setting part may set the data size by which the maximum is able to be represented, calculated by the calculation part, for at least one of the data transfer device and the control device.

According to the above configuration, the setting device calculates the maximum by using the setting information, that is, calculates the data size by which "the maximum of the change between the measurement results in the two sampling processes executed consecutively at the one control period" can be represented.

Here, the setting information may include, for example, the following information in addition to "the information indicating the number of sampling processes executed at the one control period". That is, the setting information may include information indicating "the number of pulse signals receivable by the data transfer device in one sampling process".

Here, as described above, "the number of pulse signals receivable by the data transfer device in one sampling process" may be calculated based on at least one of a specification and an application of a pulse signal generation device such as an encoder. Specifically, "the number of pulse signals receivable by the data transfer device in one sampling process" may be calculated from "a resolution and the maximum rotation speed of the pulse signal generation device" that are determined in advance based on at least one of the specification and the application.

Therefore, the setting information may include information indicating "the resolution and the maximum rotation speed of the pulse signal generation device" that are determined in advance based on at least one of the specification and the application instead of the information indicating the "number of receivable pulse signals".

The setting information may include information indicating "a pulse count method type indicating whether the pulse count method of the data transfer device that is a counter unit is unidirectional or bidirectional". The pulse count method type may indicate whether a pulse signal output by a pulse signal generation device such as an encoder that outputs the pulse signal to the data transfer device that is a counter unit is a unidirectional pulse signal or a bidirectional pulse signal.

In a case where the pulse count method is bidirectional, the change between the measurement results in the two sampling processes executed consecutively at the one control period may be positive or negative. For example, in a case where "the absolute value of the number of pulses countable in one sampling process" is "127", the change between the measurement results in the two sampling processes executed consecutively at the one control period may be indicated as "−127 to 127". Therefore, the data size by which the maximum is able to be represented is the number of bits obtained by adding 1 bit to the number of bits by which "the absolute value of the number of pulses countable in one sampling process" can be represented.

In a case where the pulse count method is unidirectional, the change between the measurement results in the two sampling processes executed consecutively at the one control period is always positive or always negative. For example, in a case where "an absolute value of the number of pulses countable in one sampling process" is "255", the change between the measurement results in the two sampling processes executed consecutively at the one control period may be indicated as "0 to 255". Therefore, a data size by which the maximum is able to be represented is the number of bits by which "the absolute value of the number of pulses countable in one sampling process" can be represented.

"The absolute value of the number of pulses countable in one sampling process" is a value obtained by rounding up digits after the decimal point of "a value obtained by dividing the sampling period indicating a period per one sampling process by the shortest period of the pulse signal". The sampling period may be calculated based on "the information indicating the number of sampling processes executed at the one control period" included in the setting information if the control period is known. The "shortest period of the pulse signal" can be calculated as the reciprocal of "the value obtained by dividing the maximum rotation speed by 60 and multiplying the division result by the resolution". As described above, the maximum rotation speed may be determined based on the specification (performance) of a pulse signal generation device such as an encoder, and may also be determined based on the application (usage) thereof.

Therefore, it is possible to achieve an effect that the setting device can accurately calculate the data size by which the maximum is able to be represented by using the setting information.

A control method for a data transfer device according to one aspect of the present invention is a control method for a data transfer device that stores a plurality of pieces of sampling data indicating respective measurement results in a plurality of sampling processes executed in one control period in one data frame and transmits the sampling data to a control device at each of the control period, and includes an acquisition step of acquiring the measurement results in the respective executed sampling processes, and a compression step of, in a case where a maximum of a change between the measurement results in two of the sampling processes executed consecutively at the one control period is determined in advance, compressing a measurement result in each of second and subsequent sampling processes among the plurality of the measurement results acquired in the acquisition step to the sampling data with a data size by which the maximum is able to be represented.

According to the above configuration, in the control method, in a case where the maximum is determined in advance, the sampling data indicating the measurement result in each of the second and subsequent sampling processes is compressed to a data size by which the maximum is able to be represented and the sampling data is transmitted to the control device.

Therefore, it is possible to achieve an effect that the control method can suppress the data size of the data frame transmitted to the control device in every control period compared with a case where each of the measurement results in the second and subsequent sampling processes is not compressed.

Here, in a case where the change may be either positive or negative, for example, in a case where a range of the change is "−127" or more and "127" or less, 8 bits obtained by adding 1 bit to 7 bits by which "127" can be represented, that is, 1 byte is a data size by which the maximum is able to be represented. Similarly, for example, in a case where a range of the change is "−1" or more and "1" or less, 2 bits obtained by adding 1 bit to 1 bit by which "1" can be represented is a data size by which the maximum is able to be represented.

In a case where the change is always positive or always negative, for example, in a case where a range of the change is "0" or more and "255" or less, 8 bits by which "255" can be represented, that is, 1 byte is a data size by which the maximum is able to be represented. Similarly, for example, in a case where the range of the change is "0" or more and "1" or less, 1 bit by which "1" can be represented is a data size by which the maximum is able to be represented.

The present invention is not limited to the above-described respective embodiments, and various modifications can be made within the scope of the claims, and the embodiments obtained by appropriately combining the technical means disclosed in the different embodiments are also included in the technical scope of the present invention.

The invention claimed is:

1. A data transfer device that stores a plurality of pieces of sampling data indicating respective measurement results in a plurality of sampling processes executed in one control period in one data frame and transmits the sampling data to a control device at each of the control period, the data transfer device comprising:
an acquisition part that acquires the measurement results in the respective executed sampling processes; and
a compression part that, in a case where a maximum of a change between the measurement results in two of the sampling processes executed consecutively at the one control period is determined in advance, compresses the measurement result in each of second and subsequent sampling processes among the plurality of the measurement results acquired by the acquisition part to the sampling data with a data size by which the maximum is able to be represented.

2. The data transfer device according to claim 1,
wherein the sampling process is a process of counting a number of pulses of a pulse signal, and
wherein the measurement result is the number of pulses that is counted.

3. The data transfer device according to claim 2,
wherein the data size by which the maximum is able to be represented is determined in advance based on (1) an absolute value of the number of pulses countable in one sampling process, and (2) whether a pulse count method in the sampling process is bidirectional or unidirectional.

4. The data transfer device according to claim 3,
wherein the compression part extracts a bit string for a number of bits by which the maximum is able to be represented, including the least significant bit, from a bit string indicating the measurement result in each of the second and subsequent sampling processes, and sets the extracted bit string as the sampling data.

5. The data transfer device according to claim 3,
wherein the compression part sets a bit string indicating an amount of change in the measurement result in each of the second and subsequent sampling processes from a measurement result in an immediately preceding sampling process as the sampling data.

6. A control device comprising:
a data frame reception part that receives the data frame at each of the control period from the data transfer device according to claim 3; and
a restoring part that restores the measurement result in each of the second and subsequent sampling processes from the sampling data compressed to the data size by which the maximum is able to be represented in the data frame received by the data frame reception part.

7. The data transfer device according to claim 2,
wherein the compression part extracts a bit string for a number of bits by which the maximum is able to be represented, including the least significant bit, from a bit string indicating the measurement result in each of the second and subsequent sampling processes, and sets the extracted bit string as the sampling data.

8. The data transfer device according to claim 2,
wherein the compression part sets a bit string indicating an amount of change in the measurement result in each of the second and subsequent sampling processes from a measurement result in an immediately preceding sampling process as the sampling data.

9. A control device comprising:
a data frame reception part that receives the data frame at each of the control period from the data transfer device according to claim 2; and
a restoring part that restores the measurement result in each of the second and subsequent sampling processes from the sampling data compressed to the data size by which the maximum is able to be represented in the data frame received by the data frame reception part.

10. The data transfer device according to claim 1,
wherein the compression part extracts a bit string for a number of bits by which the maximum is able to be represented, including the least significant bit, from a bit string indicating the measurement result in each of the second and subsequent sampling processes, and sets the extracted bit string as the sampling data.

11. A control device comprising:
a data frame reception part that receives the data frame at each of the control period from the data transfer device according to claim 10; and
a restoring part that restores the measurement result in each of the second and subsequent sampling processes from the sampling data compressed to the data size by which the maximum is able to be represented in the data frame received by the data frame reception part.

12. The data transfer device according to claim 1,
wherein the compression part sets a bit string indicating an amount of change in the measurement result in each of the second and subsequent sampling processes from a measurement result in an immediately preceding sampling process as the sampling data.

13. A control device comprising:
a data frame reception part that receives the data frame at each of the control period from the data transfer device according to claim 12; and
a restoring part that restores the measurement result in each of the second and subsequent sampling processes from the sampling data compressed to the data size by which the maximum is able to be represented in the data frame received by the data frame reception part.

14. A control device comprising:
a data frame reception part that receives the data frame at each of the control period from the data transfer device according to claim 1; and
a restoring part that restores the measurement result in each of the second and subsequent sampling processes from the sampling data compressed to the data size by which the maximum is able to be represented in the data frame received by the data frame reception part.

15. The control device according to claim 14,
wherein the restoring part restores the respective measurement results in the second and subsequent sampling processes such that an amount of change from the measurement result in the immediately preceding sampling process is equal to or less than the maximum by using a bit string indicating the measurement result in the immediately preceding sampling process and a bit string stored in the data frame as the sampling data indicating each of the measurement results in the second and subsequent sampling processes.

16. A setting device comprising:
a setting part that sets the data size by which the maximum is able to be represented for at least one of the data transfer device according to claim 1 and a control device, wherein the control device comprises:
a data frame reception part that receives the data frame at each of the control period from the data transfer device; and
a restoring part that restores the measurement result in each of the second and subsequent sampling processes from the sampling data compressed to the data size by which the maximum is able to be represented in the data frame received by the data frame reception part.

17. The setting device according to claim 16, further comprising:
a calculation part that calculates the data size by which the maximum is able to be represented by using setting information for the data transfer device, which includes information indicating a number of sampling processes executed by the data transfer device at the one control period,
wherein the setting part sets the data size by which the maximum is able to be represented calculated by the calculation part, for at least one of the data transfer device and the control device.

18. A control method for a data transfer device that stores a plurality of pieces of sampling data indicating respective measurement results in a plurality of sampling processes executed in one control period in one data frame and transmits the sampling data to a control device at each of the control period, the control method comprising:
an acquisition step of acquiring the measurement results in the respective executed sampling processes; and
a compression step of, in a case where a maximum of a change between the measurement results in two of the sampling processes executed consecutively at the one control period is determined in advance, compressing the measurement result in each of second and subsequent sampling processes among the plurality of the measurement results acquired in the acquisition step to the sampling data with a data size by which the maximum is able to be represented.

* * * * *